(12) United States Patent
Ota et al.

(10) Patent No.: US 8,933,465 B2
(45) Date of Patent: Jan. 13, 2015

(54) SEMICONDUCTOR DEVICE

(71) Applicant: Kabushiki Kaisha Toshiba, Minato-ku (JP)

(72) Inventors: Chiharu Ota, Kanagawa (JP); Tatsuo Shimizu, Tokyo (JP); Johji Nishio, Tokyo (JP); Takashi Shinohe, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/205,854

(22) Filed: Mar. 12, 2014

(65) Prior Publication Data

US 2014/0284620 A1  Sep. 25, 2014

(51) Int. Cl.
*H01L 31/0312* (2006.01)
*H01L 29/16* (2006.01)
*H01L 29/66* (2006.01)
*H01L 29/872* (2006.01)
*H01L 29/167* (2006.01)
*H01L 29/45* (2006.01)
*H01L 29/47* (2006.01)
*H01L 29/06* (2006.01)

(52) U.S. Cl.
CPC ........ *H01L 29/1608* (2013.01); *H01L 29/6606* (2013.01); *H01L 29/872* (2013.01); *H01L 29/167* (2013.01); *H01L 29/45* (2013.01); *H01L 29/47* (2013.01); *H01L 29/0619* (2013.01)
USPC ..................................... 257/77; 257/E29.104

(58) Field of Classification Search
CPC ............................ H01L 29/1608; H01L 29/45
USPC .............................................. 257/77, E29.104
See application file for complete search history.

(56) References Cited

U.S. PATENT DOCUMENTS

2004/0212011 A1* 10/2004 Ryu .............................. 257/335
2010/0289033 A1   11/2010 Ohtani et al.
(Continued)

FOREIGN PATENT DOCUMENTS

JP          10-321879        12/1998
JP          2009-167047      7/2009
(Continued)

OTHER PUBLICATIONS

U.S. Appl. No. 14/205,792, filed Mar. 12, 2014, Nishio, et al.
(Continued)

*Primary Examiner* — David S Blum
(74) *Attorney, Agent, or Firm* — Oblon, Spivak, McClelland, Maier & Neustadt, L.L.P.

(57) ABSTRACT

A semiconductor device of an embodiment includes an n-type SiC substrate, an n-type SiC layer formed on the SiC substrate; a p-type first SiC region formed in the surface of the SiC layer and contains a p-type impurity and an n-type impurity, the p-type impurity being an element A, the n-type impurity being an element D, the element A and the element D being a combination of Al, Ga, or In and N, and/or a combination of B and P, the ratio of the concentration of the element D to the concentration of the element A in the combination(s) being higher than 0.33 but lower than 0.995, the concentration of the element A forming part of the combination(s) being not lower than $1\times10^{17}$ cm$^{-3}$ and not higher than $1\times10^{22}$ cm$^{-3}$, a first electrode, and a second electrode.

10 Claims, 12 Drawing Sheets

(56) References Cited

U.S. PATENT DOCUMENTS

| | | | |
|---|---|---|---|
| 2011/0001209 A1* | 1/2011 | Watanabe et al. | 257/484 |
| 2011/0175106 A1 | 7/2011 | Mizukami et al. | |
| 2012/0025153 A1 | 2/2012 | Hirose et al. | |
| 2012/0228630 A1 | 9/2012 | Shimizu et al. | |
| 2013/0313573 A1 | 11/2013 | Mizukami et al. | |

FOREIGN PATENT DOCUMENTS

| | | |
|---|---|---|
| JP | 2011-233919 | 11/2011 |
| JP | 2012-31014 | 2/2012 |

OTHER PUBLICATIONS

U.S. Appl. No. 14/206,241, filed Mar. 12, 2014, Nishio, et al.

Extended European Search Report issued Jul. 11, 2014 in Patent Application No. 14156325.4.

Masanori Miyata, et al., "Theoretical Study of Acceptor-Donor Complexes in 4H—SiC", Applied Physics Express, vol. 1, XP055122805,(Oct. 24, 2008), pp. 111401-1-111401-3.

Bo Zhang, et al., "Solid solution of Al and N in nano-sized alpha-SiC powder bycarbothermal reduction of the xerogels of $SiO_2 \cdot Al_2O_3$", Materials Letters, vol. 51, No. 3, XP004310694, (Nov. 2001), pp. 219-224.

* cited by examiner

SEMICONDUCTOR DEVICE

CROSS-REFERENCE TO RELATED APPLICATION

This application is based upon and claims the benefit of priority from Japanese Patent Application No. 2013-059832, filed on Mar. 22, 2013, the entire contents of which are incorporated herein by reference.

FIELD

Embodiments described herein relate generally to a semiconductor device.

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low loss and is capable of high-temperature operation can be realized by taking advantage of those properties.

As power semiconductor devices, there are schottky barrier diodes (SBDs) each having a carrier potential barrier that is formed with a work function difference between a semiconductor layer and a metal electrode. Among the schottky barrier diodes, there are JBSs (Junction Barrier Schottky diodes) each having an impurity region of a different conductivity type (the p-type, for example) from that of the semiconductor layer on the surface of the semiconductor layer, so as to relax the electric field to be applied to the interface between the semiconductor layer (of the n-type, for example) and the metal electrode. Further, there are MPSs (Merged PiN-diodes Schottky-diodes) each having the metal in ohmic or almost ohmic contact with the impurity region (of the p-type, for example) of a JBS. When a voltage that is higher than the built-in potential (Vbi) of the impurity region and the semiconductor layer is applied to an MPS, minority carriers are injected, and resistance is lowered by a conductivity change. Accordingly, forward surge withstand is made higher than that of a JBS.

In a JBS or an MPS, the contact resistance between the impurity region and the metal electrode is preferably low, so as to increase the forward surge withstand. With SiC, however, it is difficult to lower the contact resistance between the impurity region and the metal electrode, because the solid solubility limit of the impurity is low, and the levels formed with the impurity in the band gap are deep.

DETAILED DESCRIPTION

Figure 1:
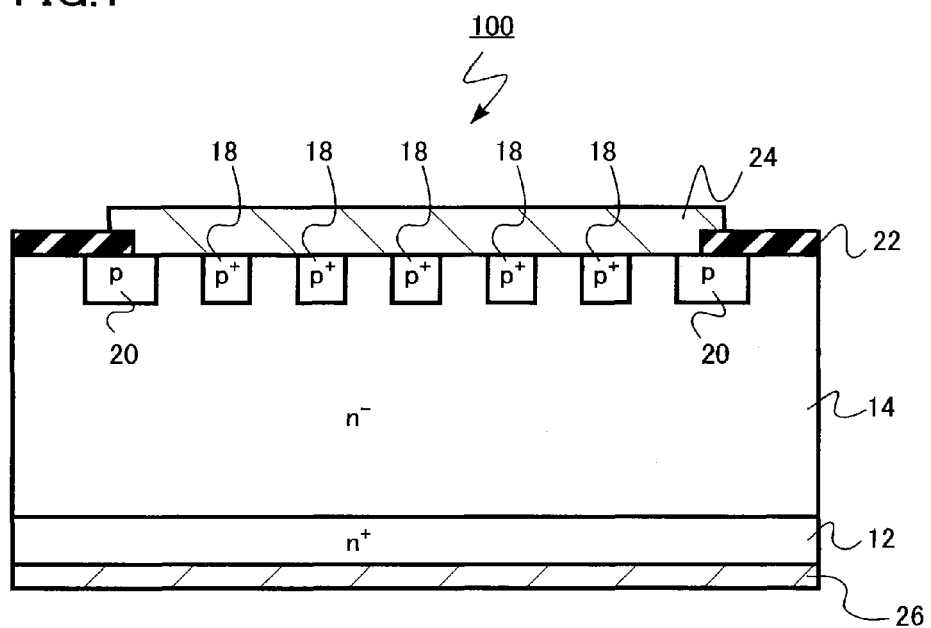
FIG. 1 is a schematic cross-sectional view of a semiconductor device of a first embodiment.

A semiconductor device of an embodiment includes: an n-type SiC substrate having first face and second face; an n-type SiC layer formed on the first face side of the SiC substrate; a p-type first SiC region that is formed in the surface of the SiC layer and contains a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), the ratio of the concentration of the element D to the concentration of the element A in the combination(s) being higher than 0.33 but lower than 0.995 (approximately equal to 1.0), the concentration of the element A forming part of the combination(s) being not lower than $1 \times 10^{17}$ cm$^{-3}$ and not higher than $1 \times 10^{22}$ cm$^{-3}$; a first electrode formed on the SiC layer and the first SiC region; and a second electrode formed on the second face side of the SiC substrate.

The following is a description of embodiments, with reference to the accompanying drawings. In the following description, like components are denoted by like reference numerals, and explanation of components described once will not be repeated.

In the following description, $n^+$, n, $n^-$, $p^+$, p, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$ type and an $n^-$ type are referred to simply as an n-type, and a $p^+$ type and a $p^-$ type are referred to simply as a p-type.

In this specification, "surge withstand" means tolerance to surge current or surge voltage. "Surge current" or "surge voltage" means current or voltage that is above the range expected in regular diode operation, regardless of whether it is in the forward direction or in the reverse direction.

First Embodiment

A semiconductor device of this embodiment includes: an n-type SiC substrate having first and second faces; an n-type SiC layer formed on the first face side of the SiC substrate; a p-type first SiC region that is formed in the surface of the SiC layer and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element D to the concentration of the element A in the combination(s) being higher than 0.33 but lower than 0.995, the concentration of the element A forming part of the combination(s) being not lower than $1\times10^{17}$ cm$^{-3}$ and not higher than $1\times10^{22}$ cm$^{-3}$; a first electrode formed on the SiC layer and the first SiC region; and a second electrode formed on the second face side of the SiC substrate.

Figure 2:
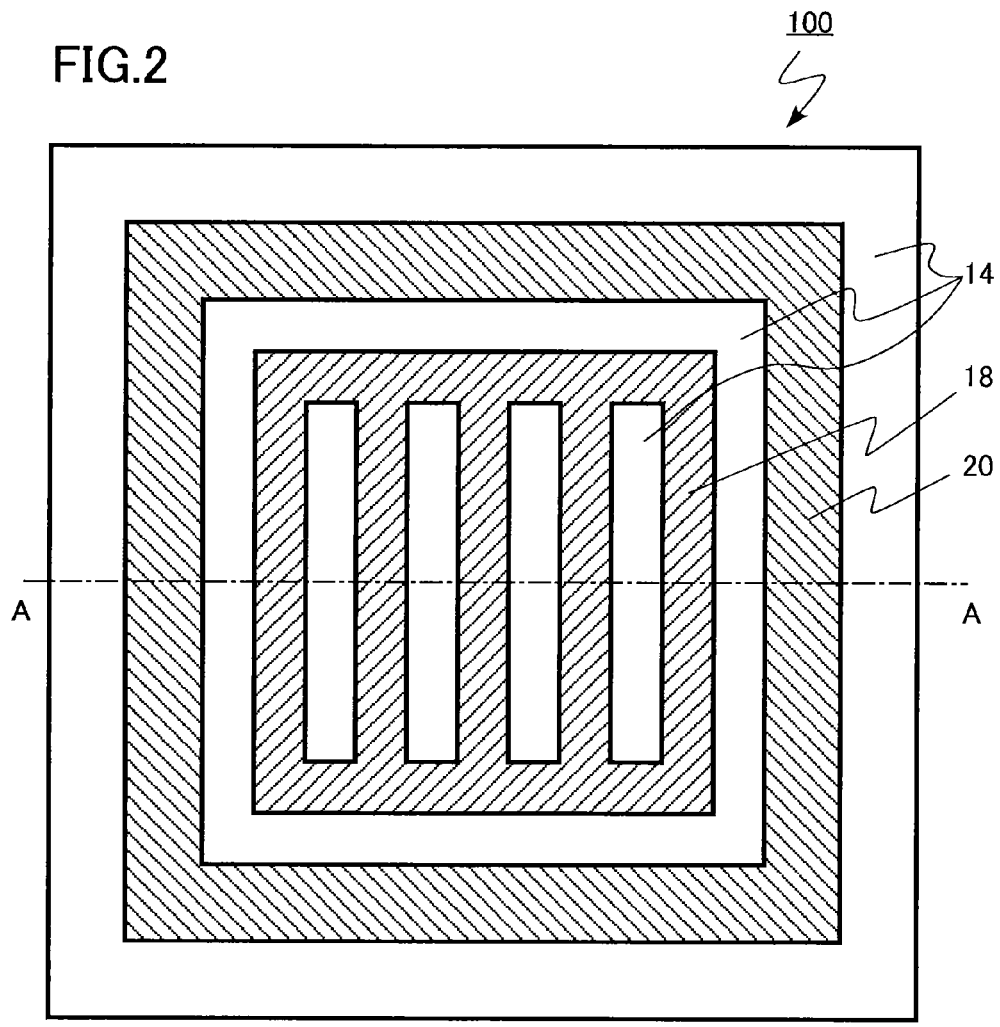
FIG. 2 is a schematic plan view of the semiconductor device of the first embodiment.

FIG. 1 is a schematic cross-sectional view of the semiconductor device of this embodiment. FIG. 2 is a schematic plan view of the semiconductor device of this embodiment. FIG. 1 is a cross-sectional view taken along the line A-A defined in FIG. 2. The semiconductor device of this embodiment is an MPS.

This MPS 100 includes a SiC substrate (a silicon carbide substrate) 12 having first and second faces. In FIG. 1, the first face is the upper face, and the second face is the lower face. This SiC substrate 12 is a 4H—SiC substrate (an n$^+$-substrate) containing N (nitrogen) as the n-type impurity at an impurity concentration that is not lower than $1\times10^{18}$ cm$^{-3}$ and not higher than $1\times10^{19}$ cm$^{-3}$, for example. An n-type SiC layer (an n$^-$-SiC layer) 14 containing the n-type impurity at an impurity concentration that is not lower than $5\times10^{15}$ cm$^{-3}$ and not higher than $2\times10^{16}$ cm$^{-3}$, for example, is formed on the first face of the SiC substrate 12. The film thickness of the n$^-$-SiC layer 14 is approximately 5 to 50 μm, for example. The impurity concentration in the n$^-$-SiC layer 14 may be a constant value within the above range, or may exhibit a concentration gradient within the above range. An intermediate layer with a higher concentration may exist between the n$^-$-SiC layer 14 and the substrate.

A p$^+$-type first SiC region 18 containing the p-type impurity at an impurity concentration that is not lower than $1\times10^{18}$ cm$^{-3}$ and not higher than $1\times10^{21}$ cm$^{-3}$, for example, is formed in part of the surface of the n$^-$-SiC layer 14. The depth of the first SiC region 18 is approximately 0.6 μM, for example. In the surface of the n$^-$-SiC layer 14, the n$^-$-SiC layer 14 has portions interposed between portions of the p$^+$-type first SiC region 18.

When a high forward voltage is unexpectedly applied to the MPS 100, the first SIC region 18 causes minority carriers to be injected into the n-type SiC layer 14, and lowers resistance through a conductivity change. As a result, the amount of forward current becomes larger, and the surge withstand becomes higher.

The p$^+$-type first SiC region 18 is co-doped with the p-type impurity and the n-type impurity. Where the p-type impurity is an element A and the n-type impurity is an element D, the element A and the element D is a combination of Al (aluminum), Ga (gallium), or In (indium) and N (nitrogen) (a first combination), and/or a combination of B (boron) and P (phosphorus) (a second combination). In other words, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element D to the concentration of the element A in the above combination(s) is higher than 0.33 but lower than 0.995, and the concentration of the element A forming part of the above combination(s) is not lower than $1\times10^{18}$ cm$^{-3}$ and not higher than $1\times10^{21}$ cm$^{-3}$, for example.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element D to the concentration of the element A and on the concentration of the element A are satisfied.

The first combination and the second combination can coexist. However, the above described conditions on the ratio of the concentration of the element D to the concentration of the element A and on the concentration of the element A should be satisfied with elements that form at least one of the first and second combinations. In other words, each of the first combination and the second combination should satisfy the conditions on the element ratio and the element concentration. This is because the later described trimers are not formed between an impurity in the first combination and an impurity in the second combination.

It should be noted that this embodiment does not exclude elements other than the above mentioned elements as p-type impurities and n-type impurities. In the following, an example case where the element A is Al (aluminum) and the element D is N (nitrogen) is described.

A junction termination structure 20 is provided outside the first SiC region 18. The junction termination structure 20 is a p-type SiC region. The concentration of the p-type impurity is not lower than $1\times10^{17}$ cm$^{-3}$ and not higher than $1\times10^{22}$ cm$^{-3}$, for example. The junction termination structure 20 relaxes the high electric field at the junction termination portions, and realizes the stable high-voltage MPS 100.

The surface of the n$^-$-SiC layer 14 is coated with an insulating film 22 formed with a silicon oxide film, for example. In the opening of the insulating film 22, a first electrode (an anode electrode) 24 made of Ni (nickel), for example, is formed on the n$^-$-SiC layer 14 and the p$^+$-type first SiC region 18. The first electrode (the anode electrode) 24 is also in contact with part of the surface of the junction termination structure 20.

The first electrode (the anode electrode) 24 is schottky-connected to the n$^-$-SiC layer 14. The first electrode (the anode electrode) 24 is preferably ohmically connected to the p$^+$-type first SiC region 18.

A second electrode (a cathode electrode) 26 made of Ni, for example, is formed on the lower face of the n$^+$-type 4H—SiC substrate 12.

In a plan view, the ring-like junction termination structure 20 is provided on the outermost circumference, and the first SiC region 18 formed by combining a ring-like portion and linear portions is provided inside the junction termination structure 20, as shown in FIG. 2. The region surrounded by the junction termination structure 20 is the active region of the MPS 100.

The first SiC region 18 preferably has a structure in which the entire region is continuous as shown in FIG. 2, so that the respective portions stably have the same potential. However, the first SiC region 18 is not necessarily formed by combining a ring-like portion and linear portions as shown in FIG. 2, but may be formed with ring-like portions, with linear portions, or with circular or polygonal island-like portions, or may be formed with any combination of those portions.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

In the following, the function and effects of this embodiment are described in detail.

It has become apparent from the results of studies made by the inventors that pairing between Al and N can be caused by co-doping SiC with Al as the p-type impurity (p-type dopant) and N as the n-type impurity (n-type dopant). In this pairing state, carrier compensation occurs, and a zero-carrier state is formed.

Figure 3:
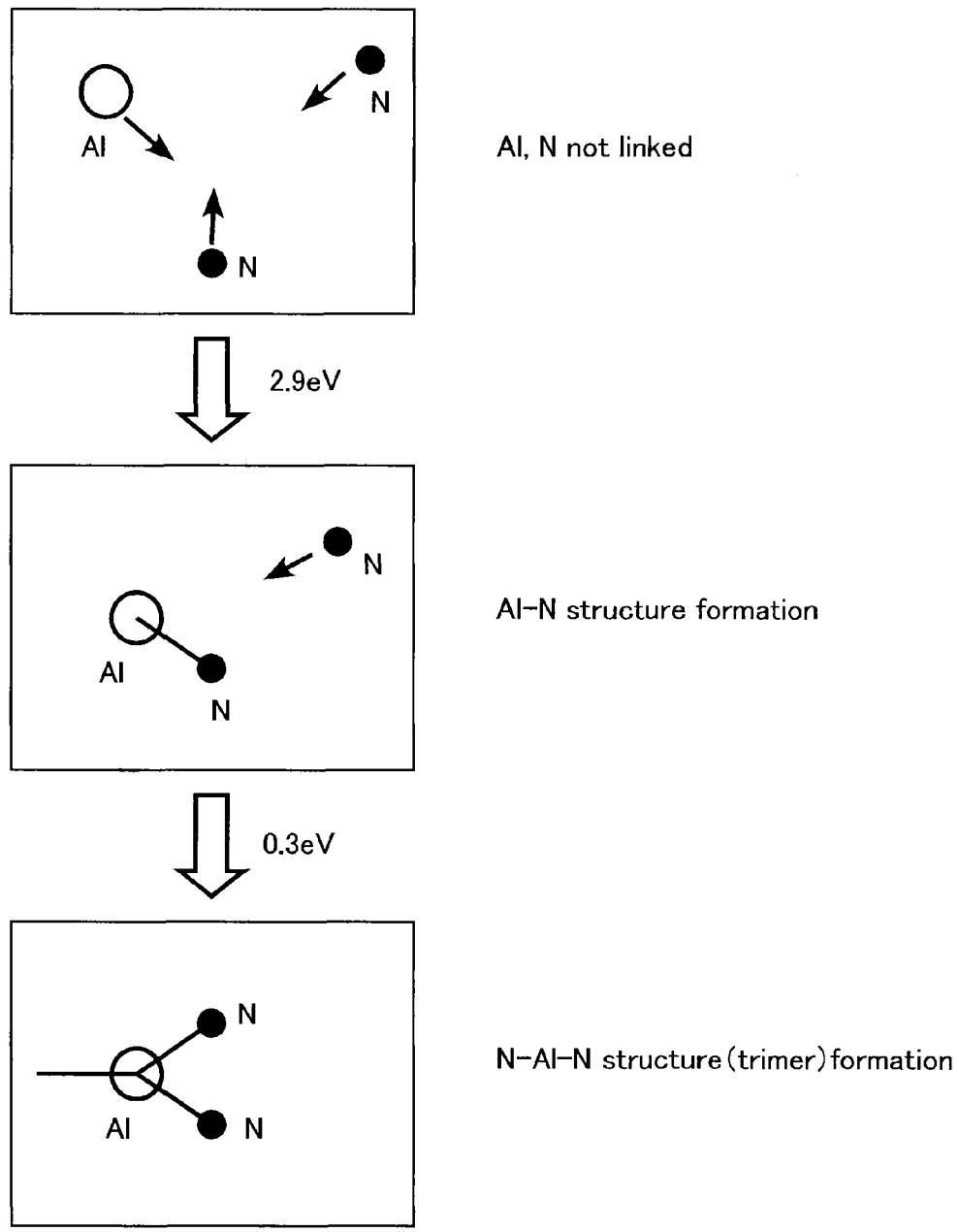
FIG. 3 is a diagram for explaining the function of co-doping.
Figure 4:
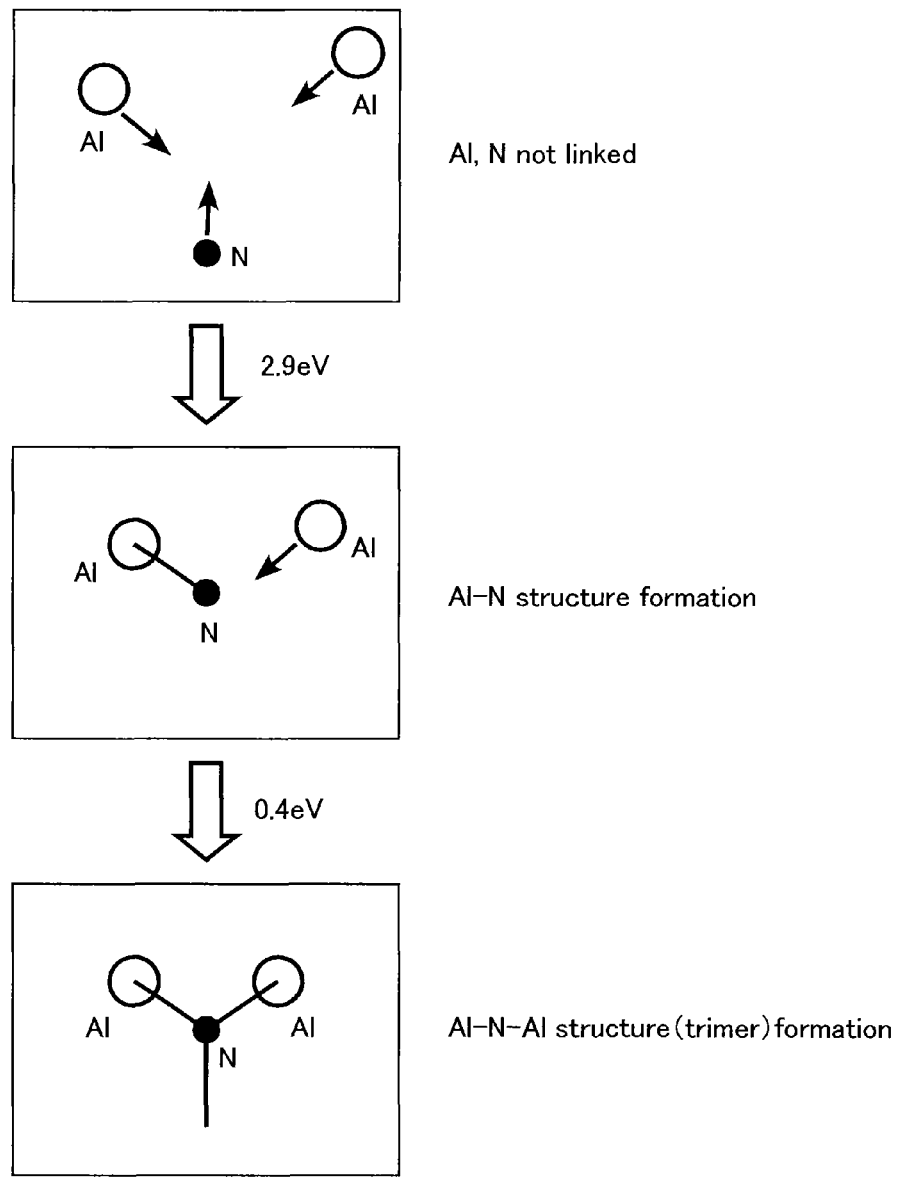
FIG. 4 is a diagram for explaining the function of co-doping.

FIGS. 3 and 4 are diagrams for explaining the function of co-doping. FIG. 3 shows the case of n-type SiC, and FIG. 4 shows the case of p-type SiC. It has become apparent from the first principle calculation performed by the inventors that Al enters Si (silicon) sites and N enters C (carbon) sites in SiC so that Al and N become adjacent to each other, and, as a result, the system becomes stable.

Specifically, as shown in FIGS. 3 and 4, where Al and N are linked to each other to form Al—N pair structures, the system becomes 2.9 eV more stable in terms of energy than that in a situation where Al and N are not linked to each other but exist independently of each other. If the Al amount and the N amount are the same, the most stable state is achieved when all of the two elements form pair structures.

Here, the first principle calculation is a calculation using ultrasoft pseudopotential. Ultrasoft pseudopotential is a type of pseudopotential, and was developed by Vanderbilt et al. For example, a lattice constant has such a high precision as to realize experimental values with a margin of error of 1% or less. Structural relaxation is achieved by introducing impurities (dopant), and the entire energy of a stable state is calculated. The energy of the entire system after a change is compared with the energy prior to the change, so as to determine which structures are in a stable state. In a stable state, in which energy positions impurity levels are located in the band gap can be indicated.

As shown in FIG. 3, it has become apparent that, in a case where the amount of N is larger than the amount of Al, or in the case of n-type SiC, extra N enters C sites located in the vicinities of Al—N pair structures, to form N—Al—N trimers and further stabilize the system. According to the first principle calculation, trimers are formed, and the system becomes 0.3 eV more stable than that in a case where pair structures exist separately from N.

Likewise, as shown in FIG. 4, it has become apparent that, in a case where the amount of Al is larger than the amount of N, or in the case of p-type SiC, extra Al enters Si sites located in the vicinities of Al—N pair structures, to form Al—N—Al trimers and further stabilize the system. According to the first principle calculation, trimers are formed, and the system becomes 0.4 eV more stable than that in a case where Al—N pair structures exist separately from Al.

Next, dopant combinations other than the combination of Al and N are discussed. Calculation results obtained in a case where a calculation was conducted for a combination of B (boron) and N (nitrogen) are described below.

B enters Si sites, and N enters C sites. According to the first principle calculation, B—N—B or N—B—N trimeric structures cannot be formed. Specifically, B—N pair structures are formed, but the energy of the system becomes higher when B or N approaches the B—N pair structures. However, the system is more stable in terms of energy when extra B or N exists in positions sufficiently away from the pair structures.

According to the first principle calculation, when extra B forms trimers, the energy of the system is 0.5 eV higher than that in a case where B—N pairs exist independently of B. Also, when extra N forms trimers, the energy of the system is 0.3 eV higher than that in a case where B—N pairs exist independently of N. Therefore, in either case, the system becomes unstable in terms of energy when trimers are formed.

Figure 5:
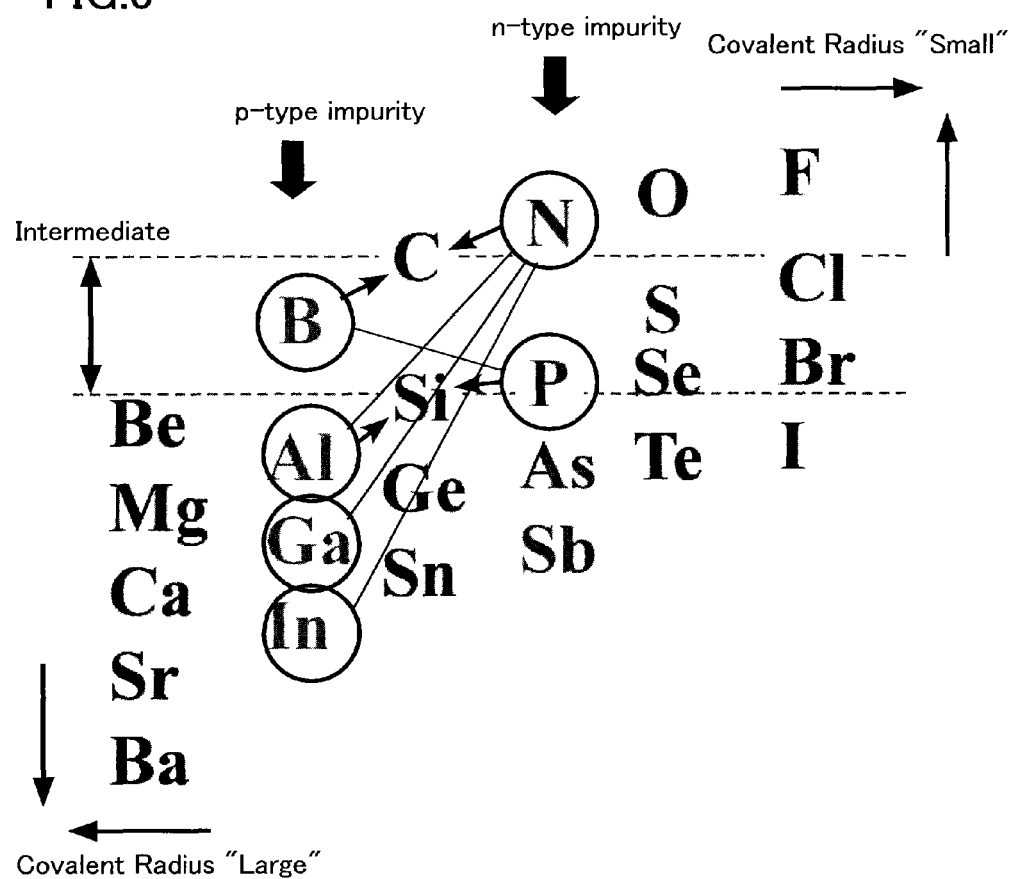
FIG. 5 is a diagram for explaining the function of co-doping.

FIG. 5 is a diagram for explaining the function of co-doping. FIG. 5 shows the covalent radii of respective elements. Elements with smaller covalent radii are shown in the upper right portion in the drawing, and elements with larger covalent radii are shown in the lower left portion.

Considering the covalent radii, it is understandable that the system becomes unstable when trimers are formed with B and N. The covalent radius of B is smaller than the covalent radius of Si, and the covalent radius of N is smaller than the covalent radius of C. Therefore, when B enters Si sites and N enters C sites, strain accumulates, and trimers cannot be formed.

It has become apparent that trimers are not formed with combinations of the p-type impurity and the n-type impurity as dopant other than the combinations of "an element (Al, Ga, or In) having a larger covalent radius than that of Si" and "an element (N) having a smaller covalent radius than that of C", and the reverse combination of "an element (B) having a larger covalent radius than that of C" and "an element (P) having a smaller covalent radius than that of Si".

Since the covalent radii of B and P are between the covalent radius of Si and the covalent radius of C, B and P can enter both Si sites and C sites. However, the other impurities (Al, Ga, In, N, and As) basically enter either Si sites or C sites. It is safe to say that Al, Ga, In, and As enter Si sites, and N enters C sites.

Furthermore, when both impurities enter Si sites or both impurities enter C sites, there is no need to take into account such an aspect. This is because it is difficult to relax strain unless the p-type impurity and the n-type impurity are located at the closest distance from each other. Therefore, where the p-type impurity is the element A and the n-type impurity is the element D, it is difficult to form trimers with combinations of the element A and the element D other than the four combinations of "Al and N", "Ga and N", "In and N", and "B and P".

The pair structures or the trimeric structures cannot be formed unless there is interaction between atoms. If approximately 10 unit cells exist in the c-axis direction, the interaction is invisible, and the impurity levels (dopant levels) in a 4H—SiC structure according to the first principle calculation are in a flat state. That is, diffusion is sufficiently restrained, and is on the order of approximately 10 meV.

In other words, it is considered that interaction does not easily occur when the distance between impurities is 10 nm or longer. In view of this, to maintain interaction between impurities, the impurity concentrations are preferably $1 \times 10^{18}$ cm$^{-3}$ or higher. However, if the impurity concentrations are $1 \times 10^{17}$ cm$^{-3}$ or higher, a certain number of trimers are expected to be formed.

This value is the lower limit of impurity concentrations that is desired when a local impurity distribution is formed through ion implantation in a case where an SiC material has already been formed.

To cause an effect of co-doping to appear in semiconductor SiC, the ratio between the n-type impurity concentration and the p-type impurity concentration needs to be restricted within a specific range. By the later described manufacturing method, it is critical that the ratio between the n-type and p-type impurities to be introduced by ion implantation be set at a ratio within the specific range from the start. Although the reach of interaction is as short as less than 10 nm, trimers can be formed by virtue of the attraction force of each other within the reach. Furthermore, as the attraction force is applied, the temperature of the activating anneal for the impurities can be lowered from 1700-1900° C., which is the temperature range in a case where co-doping is not performed, to 1500-1800° C.

However, the impurity concentration desirable for trimer formation can be lowered in crystal growth from a vapor phase by CVD (Chemical Vapor Deposition) or the like. This is because raw material can be made to flow in the surface, and accordingly, interaction between the impurities can easily occur at low concentrations.

In vapor phase growth, the range of impurity concentrations for trimer formation is $1 \times 10^{15}$ cm$^{-3}$ to $1 \times 10^{22}$ cm$^{-3}$, which is wider than that with ion implantation. In vapor phase growth, it is possible to lower the impurity concentration in SiC to approximately $1 \times 10^{16}$ cm$^{-3}$ or increase the impurity concentration in SiC to approximately $1 \times 10^{21}$ cm$^{-3}$, for example. Particularly, it is difficult to form a low-concentration region through ion implantation. Therefore, impurity region formation through vapor phase growth is particularly effective in a low-concentration region. Furthermore, it is possible to form a co-doped film as thin as 5 nm, for example, through vapor phase growth.

Vapor phase growth also has the advantage that defects in crystals are not easily formed in regions containing impurities at high concentrations. In the case of ion implantation, defects in crystals increase as the amount of introduced impurities becomes larger, and recovery through a heat treatment or the like also becomes difficult. By vapor phase growth, trimers are formed during the growth, and defects due to impurity implantation are hardly formed. In view of this, impurity region formation through vapor phase growth is effective in regions having impurity concentrations of $1 \times 10^{19}$ cm$^{-3}$ or higher, or more preferably, $1 \times 10^{20}$ cm$^{-3}$ or higher, for example.

As described above, vapor phase growth has effects that cannot be achieved by ion implantation. However, impurity regions that are locally co-doped can be formed through ion implantation. Also, co-doped impurity regions can be formed at low costs. Therefore, either vapor phase growth or ion implantation should be used where appropriate.

When trimers are to be formed at the time of crystal growth from a vapor phase, the concentrations of the p-type and n-type impurities are preferably $1 \times 10^{15}$ cm$^{-3}$ or higher. Further, so as to facilitate the trimer formation, the impurity concentrations are preferably $1 \times 10^{16}$ cm$^{-3}$ or higher.

When trimers are formed, the upper limit of impurity concentrations may exceed the solid solubility limit of cases where trimers are not formed. This is because, when trimers are formed, strain in crystals is relaxed, and the impurities are easily solved.

The impurity solid solubility limit in a case where trimers are not formed is on the order of $10^{19}$ cm$^{-3}$ in the case of N, and is on the order of $10^{21}$ cm$^{-3}$ even in the case of Al. As for the other impurities, the solid solubility limit is on the order of approximately $10^{21}$ cm$^{-3}$.

When only one type of impurity is used, the size of the impurity is either small or large. Therefore, strain accumulates, and the impurity cannot easily enter lattice points. As a result, activation cannot be caused. Particularly, in the case of ion implantation, a large number of defects are formed, and the solid solubility limit becomes even lower.

However, when trimers are formed, both Al and N can be implanted up to the order of approximately $10^{22}$ cm$^{-3}$. As strain can be relaxed by forming trimers with one of the four combinations of "Al and N", "Ga and N", "In and N", and "B and P", the solid solubility limit can be extended. As a result, the impurity solid solubility limit can be extended to the order of $10^{22}$ cm$^{-3}$.

In a case where the impurity is B, Al, Ga, In, or P, strain is large, and a large number of defects exist, if the impurity concentration is $1 \times 10^{20}$ cm$^{-3}$ or higher, or more particularly, $6 \times 10^{20}$ cm$^{-3}$ or higher. As a result, sheet resistance or resistivity becomes very high.

However, co-doping with the p-type impurity and the n-type impurity can reduce defects even in regions having such high impurity concentrations.

When an impurity is N, the solid solubility limit is further lowered by one digit to approximately $2 \times 10^{19}$ cm$^{-3}$. According to the first principle calculation, this is probably because defects of inactive interstitial N are formed.

As trimers are formed, the upper limit of the N concentration is dramatically increased from the order of $10^{19}$ cm$^{-3}$ to the order of $10^{22}$ cm$^{-3}$. In a case where an n-type region doped at a high concentration is to be formed, nitrogen cannot be normally used, and P ions are implanted at approximately $10^{20}$ cm$^{-3}$, for example. In this embodiment, however, an n-type region doped at a high concentration can be formed by using nitrogen. For example, N is implanted at $2 \times 10^{20}$ cm$^{-3}$, and Al is implanted at $1 \times 10^{20}$ cm$^{-3}$. It is normally difficult to use nitrogen, but nitrogen can be used in this embodiment.

As described above, both the p-type impurity and the n-type impurity are implanted, and an appropriate combination of covalent radii is selected, so that trimers can be formed. The structures are then stabilized, and strain can be reduced.

As a result, (1) the respective impurities can easily enter lattice points, (2) the process temperature can be lowered, and a temperature decrease of at least 100° C. can be expected, (3) the amount of impurities that can be activated increases (the upper limit is extended), (4) stable structures such as trimers or pair structures can be formed, andentropy is increased and crystal defects are reduced with the structures, and (5) as the trimers are stable, revolutions around the bonds that bind the p-type impurity and the n-type impurity become difficult, and the structures are immobilized. Accordingly, energization breakdown tolerance becomes dramatically higher. For example, when trimeric structures are formed in at least part of the p-type impurity region and the n-type impurity region of a pn junction, energization breakdown is restrained, and an increase in resistance can be avoided. As a result, a degradation phenomenon (Vf degradation) in which the voltage (Vf) required to be applied so as to apply a certain amount of current becomes higher can be restrained.

As described above, pairing between Al and N can be caused by co-doping with Al as the p-type impurity and N as the n-type impurity. Furthermore, it has become apparent from the first principle calculation that both acceptor levels and donor levels can be made shallower at this point.

Figure 6:
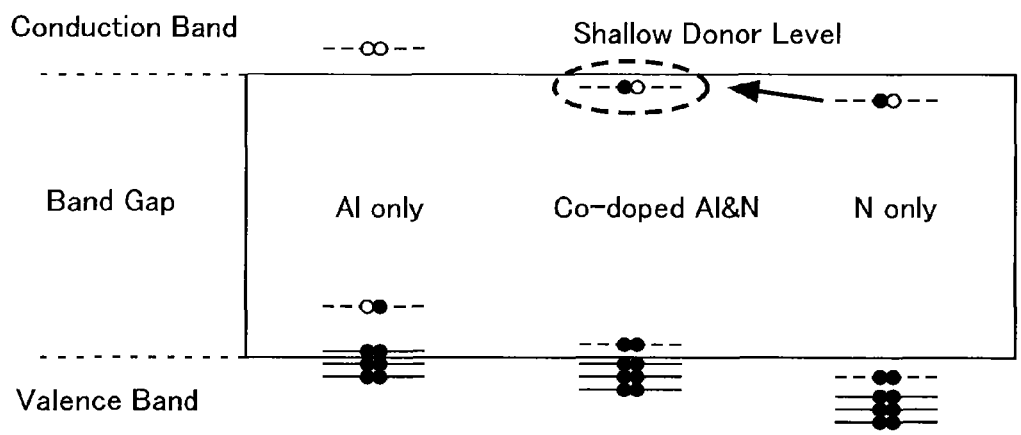
FIG. 6 is a diagram for explaining the function of co-doping.
Figure 7:
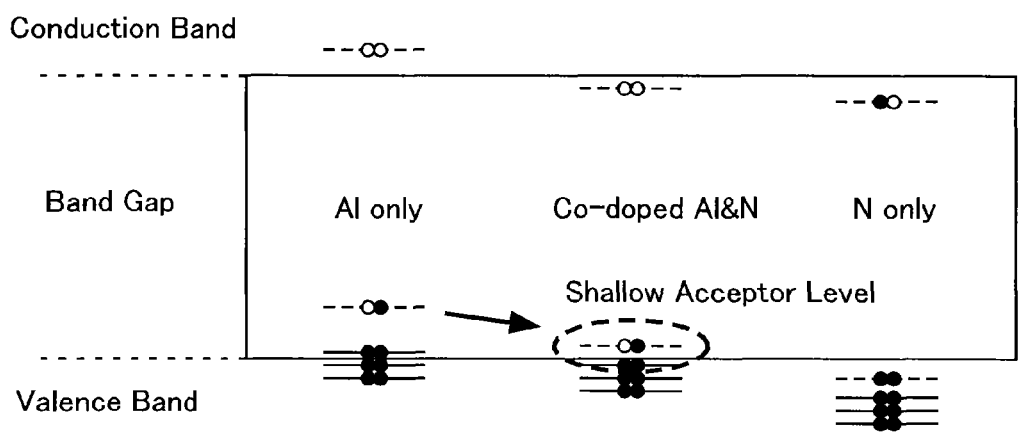
FIG. 7 is a diagram for explaining the function of co-doping.

FIGS. 6 and 7 are diagrams for explaining the function of co-doping. FIG. 6 illustrates a case of n-type SiC, and FIG. 7 illustrates a case of p-type SiC. White circles represent empty levels not filled with electrons, and black circles represent levels filled with electrons.

The reason that the donor levels become shallower is that the empty levels located within the conduction band of Al as the acceptor interact with the donor levels of N, and the donor levels are raised, as shown in FIG. 6. Likewise, the reason that the acceptor levels become shallower is that the levels that are filled with electrons and are located within the valence band of N as the donor interact with the acceptor levels of Al, and the acceptor levels are lowered, as shown in FIG. 7.

Normally, N or P (phosphorus) as the n-type impurity forms donor levels that are as deep as 42 to 95 meV. B, Al, Ga, or In as the p-type impurity forms very deep acceptor levels of 160 to 300 meV. If trimers are formed, on the other hand, the n-type impurity can form donor levels of 35 meV or shallower, and the p-type impurity can form acceptor levels of 100 meV or shallower.

In an optimum state where trimers are completely formed, n-type N or P forms levels of approximately 20 meV, and p-type B, Al, Ga, or In forms levels of approximately 40 meV. As such shallow levels are formed, most of the activated impurities turn into carriers (free electrons and free holes). Accordingly, the bulk resistance becomes one or more digits lower than that in a case where co-doping is not performed.

In the case of n-type SiC, the donor levels that contribute to carrier generation becomes 40 meV or shallower, and as a result, the resistance becomes lower than that in a case where co-doping is not performed. Also, as the donor levels become 35 meV or shallower, the resistance is lowered by approximately one digit. As the donor levels become 20 meV or shallower, the resistance is lowered by approximately two digits. However, a strain relaxation effect and a doping upper limit extension effect are also achieved.

In the case of p-type SiC, the acceptor levels that contribute to carrier generation becomes 150 meV or shallower, and as a result, the resistance becomes lower than that in a case where co-doping is not performed. Also, as the acceptor levels become 100 meV or shallower, the resistance is lowered by approximately one digit. As the acceptor levels become 40 meV or shallower, the resistance is lowered by approximately two digits. However, a strain relaxation effect and a doping upper limit extension effect are also achieved.

When the Al concentration and the N concentration are the same (N:Al=1:1), an insulator is formed, because there are no carriers though there are shallow levels. There exist carriers that are equivalent to a difference between the Al concentration and the N concentration. To form a low-resistance semiconductor, a concentration difference is required.

When the N concentration is higher than the Al concentration (N concentration>Al concentration), extra N generated as a result of formation of Al—N pairs through interaction is also stabilized by displacing C located in the vicinities of the Al—N pairs. Accordingly, shallow donor levels are formed. Also, strain is relaxed. Accordingly, the N concentration can be made higher than that in a case where trimers are not formed.

Figure 8:
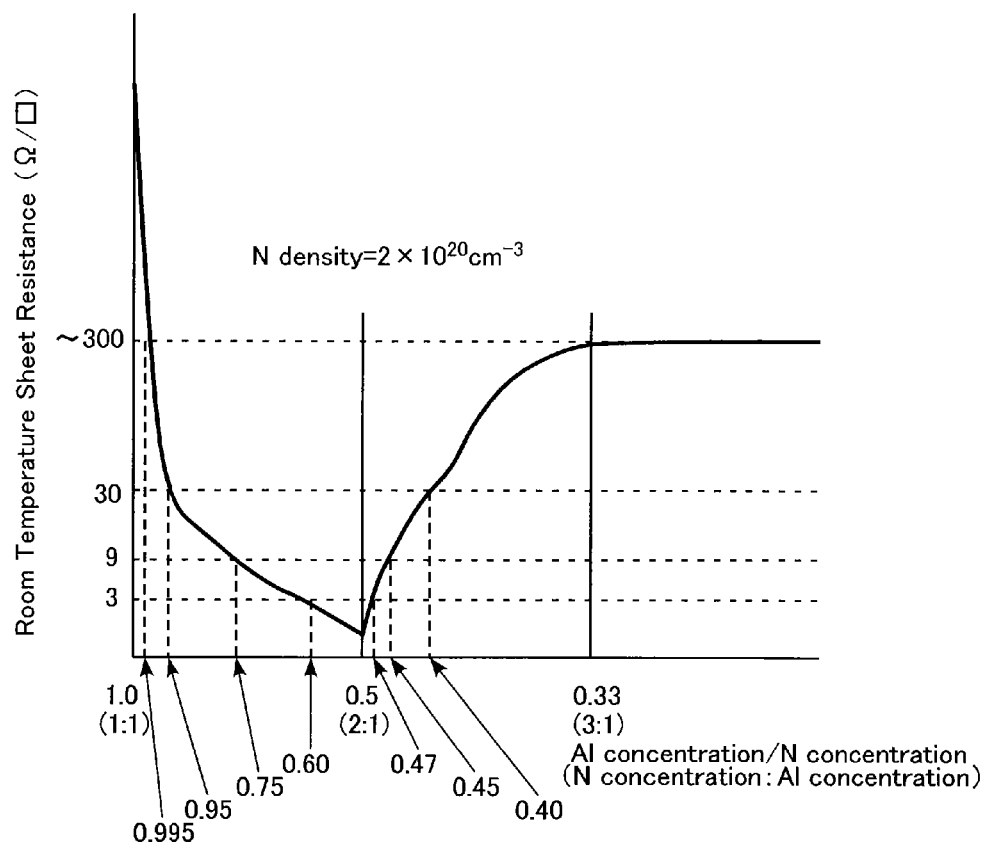
FIG. 8 is a diagram showing the relationship between Al and N concentrations and sheet resistance in the case of n-type SiC.

FIG. 8 is a diagram showing the relationship between Al and N concentrations and sheet resistance in the case of n-type SiC. The N concentration is $2\times10^{20}$ cm$^{-3}$. When only N is implanted, the sheet resistance cannot be lowered even if N is implanted at $1\times10^{19}$ cm$^{-3}$ or higher. The value is approximately 300 Ω/□.

While "N concentration:Al concentration" is changing from 1:1 to 2:1, trimers are formed without strain, and the number of carrier electrons in the shallow donor levels increases. Accordingly, the sheet resistance rapidly decreases.

When the ratio reaches 2:1, the maximum amount of carriers is available, and the sheet resistance becomes lowest. As shown in FIG. 8, the sheet resistance can be lowered down to approximately 1.5Ω/□. The contact resistance to n-type SiC can also be lowered from approximately $10^{-5}$ Ωcm$^{-3}$ to approximately $10^{-7}$ Ωcm$^{-3}$ by making "N concentration:Al concentration" equal to 2:1 and increasing the difference between the N concentration and the Al concentration from $10^{20}$ cm$^{-3}$ to $10^{22}$ cm$^{-3}$.

Furthermore, if the ratio of the N concentration becomes higher than 2:1, the original deep donor levels are formed by the extra N that exceeds "N concentration:Al concentration=2:1". The donor levels receive carrier electrons, and the shallow donor levels formed with trimers become empty. The excess N left out from "N concentration:Al concentration=2:1" is similar to N introduced independently. Therefore, strain relaxation is difficult. As a result, the sheet resistance rapidly increases as shown in FIG. 8.

In FIG. 8, the target for comparison is the sheet resistance (approximately 300Ω/□ in this case) in a case where N (nitrogen) as the n-type impurity is implanted almost up to the solid solubility limit when co-doping with Al is not performed, and changes in the sheet resistance value seen when "N concentration:Al concentration" is changed from 2:1 are shown.

The following description centers around "Al concentration/N concentration=0.5", at which trimer structures are formed. In a case where "Al concentration/N concentration" is not lower than 0.47 and not higher than 0.60 (100% of the carriers of $8\times10^{19}$ cm$^{-3}$ or higher being free carriers), or where the p-type impurity is implanted at 47 to 60% with respect to the n-type impurity, the sheet resistance is two digits lower than the sheet resistance obtained in a case co-doping with Al is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

In a case where the range is widened in both directions, and "Al concentration/N concentration" is not lower than 0.45 and not higher than 0.75 (100% of the carriers of $5\times10^{19}$ cm$^{-3}$ or higher being free carriers), or where Al is implanted at 45 to 75% with respect to N, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "Al concentration/N concentration" is higher than 0.40 but lower than 0.95 (100% of the carriers of $1\times10^{19}$ cm$^{-3}$ or higher being free carriers), or where Al is implanted at 40 to 95% with respect to N, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved on the side where Al is implanted at 50% or more with respect to N, because strain is sufficiently relaxed. The 50% state is the state where two N atoms and one Al atom are clustered to form a trimer. When the ratio is lower than 50%, trimers are formed, and extra N exists. Since there is N that cannot form trimers, an equivalent amount of strain accumulates. N that cannot form trimers is the same as that introduced independently, and reaches the limit of strain in no time. When the amount of Al is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

When "Al concentration/N concentration" is 0.995, the number of carriers is almost the same as that in a case where co-doping is not performed. Since 100% of the carriers of $1 \times 10^{18}$ cm$^{-3}$ or higher, which is 0.5% of $2 \times 10^{20}$ cm$^{-3}$, are free carriers, the sheet resistance to be obtained with conventional nitrogen doping can be realized. Accordingly, the sheet resistance is almost the same as that in a case where co-doping is not performed. In a case where "Al concentration/N concentration" is 0.33 or where "N concentration:Al concentration" is 3:1, all carrier electrons are received not by shallow donor levels formed with trimers but by deep donor levels formed with extra N. Accordingly, the sheet resistance is almost the same as that in a case where co-doping is not performed. Therefore, the resistance is lowered by co-doping in cases where "Al concentration/N concentration" is higher than 0.33 but lower than 0.995, or where Al is implanted at 33 to 99.5% with respect to N. With the margin of error being taken into account, it can be considered that the ratio of Al to N should be higher than 33% but lower than 100%.

When the Al concentration is higher than the N concentration (Al concentration>N concentration), extra Al generated as a result of formation of Al—N pairs through interaction is also stabilized by displacing Si located in the vicinities of the Al—N pairs. Accordingly, shallow acceptor levels are formed. Also, strain is relaxed. Accordingly, the Al concentration can be made higher than that in a case where trimers are not formed. This case can be considered to be the same as the case where the N concentration is higher than the Al concentration.

Figure 9:
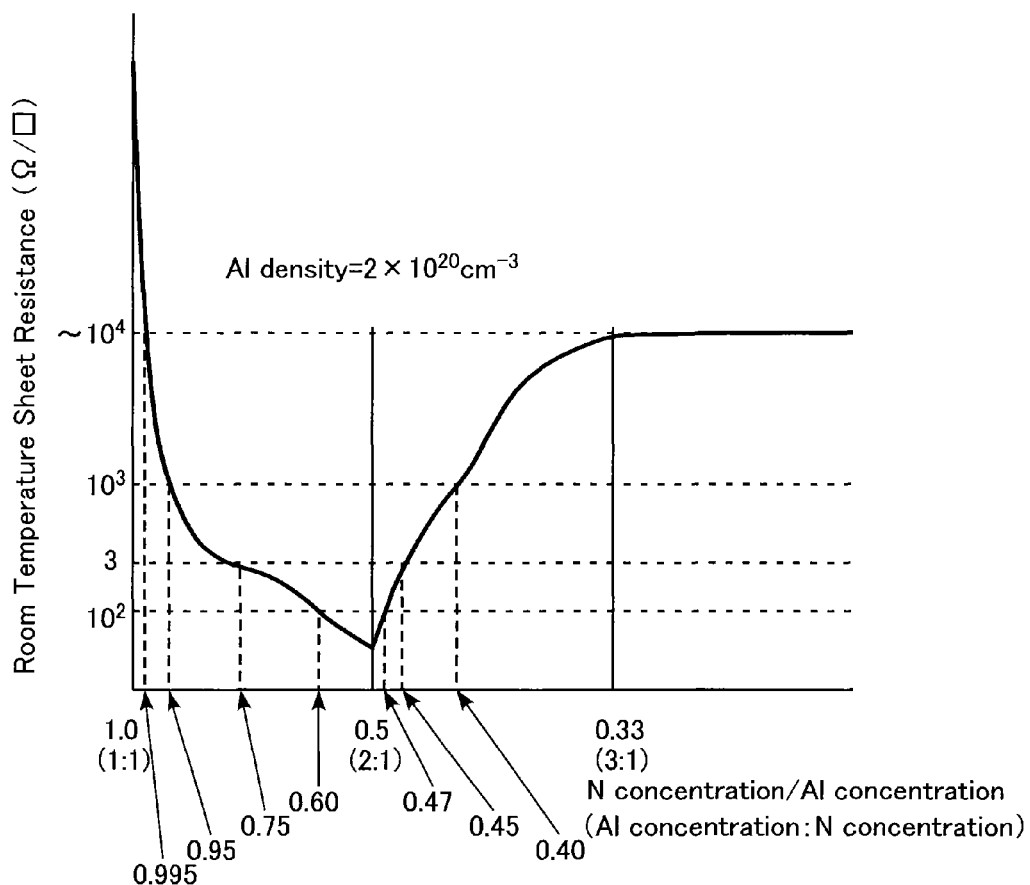
FIG. 9 is a diagram showing the relationship between N and Al concentrations and sheet resistance in the case of p-type SiC.

FIG. 9 is a diagram showing the relationship between N and Al concentrations and sheet resistance in the case of p-type SiC. The Al concentration is $2 \times 10^{20}$ cm$^{-3}$.

While "Al concentration:N concentration" is changing from 1:1 to 2:1, trimers are formed without strain, and the number of carrier holes in the shallow acceptor levels increases. Accordingly, the sheet resistance decreases.

When the ratio reaches 2:1, the maximum amount of carriers is available, and the sheet resistance becomes lowest. As shown in FIG. 9, the sheet resistance can be lowered down to approximately 40Ω/□. The contact resistance to p-type SiC can also be lowered from approximately $10^{-5}$ Ωcm$^{-3}$ to approximately $10^{-7}$ Ωcm$^{-3}$ by making "Al concentration:N concentration" equal to 2:1 and increasing the difference between the Al concentration and the N concentration from $10^{20}$ cm$^{-3}$ to $10^{22}$ cm$^{-3}$.

Furthermore, if the ratio of the Al concentration becomes higher than 2:1, the original deep acceptor levels are formed by the extra Al that exceeds "Al concentration:N concentration=2:1". The acceptor levels receive carrier holes, and the shallow acceptor levels formed with trimers are filled with electrons. The excess Al left out from "Al concentration:N concentration=2:1" is similar to N introduced independently. Therefore, strain relaxation is difficult. As a result, the sheet resistance rapidly increases as shown in FIG. 9.

In FIG. 9, the target for comparison is the sheet resistance (approximately 10 KΩ/□ in this case) in a case where Al (aluminum) as the p-type impurity is implanted almost up to the solid solubility limit when co-doping with N is not performed, and changes in the sheet resistance value seen when "Al concentration:N concentration" is changed from 2:1 are shown.

The following description centers around "N concentration/Al concentration=0.5", at which trimer structures are formed. In a case where "N concentration/Al concentration" is not lower than 0.47 and not higher than 0.60 (100% of the carriers of $8 \times 10^{19}$ cm$^{-3}$ or higher being free carriers), or where the n-type impurity is implanted at 47 to 60% with respect to the p-type impurity, the sheet resistance is two digits lower than the sheet resistance obtained in a case where co-doping with N is not performed. Such a concentration ratio is highly advantageous. When the ratio is lower than 0.5, shallow levels decrease, and strain is caused. As a result, the number of free carriers decreases, and carriers equivalent to $8 \times 10^{19}$ cm$^{-3}$ are obtained when the ratio is approximately 0.47.

In a case where the range is widened in both directions, and "N concentration/Al concentration" is not lower than 0.45 and not higher than 0.75 (100% of the carriers of $5 \times 10^{19}$ cm$^{-3}$ or higher being free carriers), or where N is implanted at 45 to 75% with respect to Al, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5 \times 10^{19}$ cm$^{-3}$ are obtained when the ratio is approximately 0.45. In a case where the range is further widened in both directions and "N concentration/Al concentration" is higher than 0.40 but lower than 0.95 (100% of the carriers of $1 \times 10^{19}$ cm$^{-3}$ or higher being free carriers), or where N is implanted at 40 to 95% with respect to Al, the sheet resistance becomes one digit lower. When the ratio is lower than 0.5, shallow levels decrease, and strain is caused. As a result, the number of free carriers decreases, and carriers equivalent to $1 \times 10^{19}$ cm$^{-3}$ are obtained when the ratio is approximately 0.40.

Better characteristics are achieved in cases where N is implanted at 50% or more with respect to Al, because strain is sufficiently relaxed. When N is less than 50%, on the other hand, trimers formed with one N atom and two Al atoms that are clustered account for 50% of the entire structure, and further, Al exists therein. Since there is Al that cannot form trimers, an equivalent amount of strain accumulates. When the amount of N is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "N concentration/Al concentration" is 0.995, and the number of carriers is almost the same as that in a case where co-doping is not performed. Since 100% of the carriers of $1 \times 10^{18}$ cm$^{-3}$ or higher, which is 0.5% of $2 \times 10^{20}$ cm$^{-3}$, are free carriers, the sheet resistance to be achieved with conventional Al doping can be realized. Accordingly, the sheet resistance is almost the same as that in a case where co-doping is not performed. Ina case where "N concentration/Al concentration" is 0.33 or where "Al concentration:N concentration" is 3:1, all carrier holes are received not by shallow acceptor levels formed with trimers but by deep acceptor levels formed with extra Al. Accordingly, the sheet resistance is almost the same as that in a case where co-doping is not performed. Therefore, a resistance lowering effect is achieved by co-doping in cases where "N concentration/Al concentration" is higher than 0.33 but lower than 0.995, or where N is implanted at 33 to 99.5% with respect to Al. With the margin of error being taken into account, it can be considered that the ratio of N to Al should be higher than 33% but lower than 100%.

When co-doping is not performed, a low-resistance SiC semiconductor material containing impurities having low concentrations of $1\times10^{18}$ cm$^{-3}$ or lower cannot exist. However, when trimers are formed by co-doping, shallow levels are formed, and the number of carriers increases. Accordingly, a reduction in resistance can be achieved with small amounts of impurities.

Co-doping with the p-type impurity and the n-type impurity at an appropriate ratio as described above can achieve at least two notable effects.

First, strain is relaxed, and SiC with less strain can be formed. Compared with a case where co-doping is not performed, strain is smaller, the number of defects is smaller, and larger amounts of impurities can be implanted. That is, the solid solubility limits of impurities can be raised. Accordingly, the sheet resistance, the resistivity, and the contact resistance are lowered. As fewer defects are formed by either ion implantation or epitaxial growth, dosing of large amounts of impurities can be performed.

Secondly, shallow levels can be formed. Compared with a case where co-doping is not performed, a low-resistance material can be formed with smaller amounts of impurities. Alternatively, a sheet resistance that is one or more digits lower can be achieved with the same amounts of impurities as those in a case where co-doping is not performed. In a region that can be formed through epitaxial growth and contains a low-dose impurity, the resistance becomes higher unless co-doping is performed. However, low-resistance SiC can be formed when co-doping is performed. Accordingly, an SiC semiconductor device having a lower ON resistance can be manufactured.

In the MPS 100 of this embodiment, the p$^+$-type first SiC region 18 is co-doped with a p-type impurity such as Al and an n-type impurity such as N. As a result, the sheet resistance and the resistivity of the p$^+$-type first SiC region 18 are lowered. Also, the contact resistance between the first SiC region 18 and the first electrode 24 is lowered. Accordingly, the surge withstand is increased, and the highly-reliable MPS 100 is realized.

As trimers are formed, the crystalline structures are stabilized, and the number of crystal defects decreases. Accordingly, the MPS 100 having smaller leakage current is realized. Furthermore, as the number of crystal defects decreases, the ON resistance is also lowered.

The concentration of the p-type impurity contained in the first SiC region 18 is preferably not lower than $1\times10^{18}$ cm$^{-3}$ and not higher than $1\times10^{22}$ cm$^{-3}$. This is because, if the concentration is below the range, there is a possibility that interaction between the p-type impurity and the n-type impurity does not easily occur, and trimers are not easily formed, particularly when co-doping is performed through ion implantation. This is also because, if the concentration is below the range, the contact resistance between the first SiC region 18 and the first electrode 24 is not sufficiently lowered, and the surge withstand might become lower. This is also because it is difficult to solve a p-type impurity having a concentration above the range.

So as to sufficiently lower the sheet resistance or the resistivity of the first SiC region 18 and the contact resistance between the first SiC region 18 and the first electrode 24, and stabilize the surge withstand, the concentration of the p-type impurity contained in the first SiC region 18 is preferably $1\times10^{19}$ cm$^{-3}$ or higher. So as to reduce leakage current between the first SiC region 18 and the SiC layer 14, the concentration of the p-type impurity is preferably $1\times10^{21}$ cm$^{-3}$ or lower.

In a case where the p-type impurity is the element A and the n-type impurity is the element D in the first SiC region 18, the ratio of the concentration of the element D to the concentration of the element A is higher than 0.33 but lower than 0.995, so as to sufficiently lower the sheet resistance or the resistivity of the first SiC region 18 and the contact resistance between the first SiC region 18 and the first electrode 24. Also, the ratio of the concentration of the element D to the concentration of the element A is preferably higher than 0.40 but lower than 0.95. More preferably, the ratio is not lower than 0.95 and not higher than 0.75. Even more preferably, the ratio is not lower than 0.47 and not higher than 0.60.

The ratio of the concentration of the element D to the concentration of the element A can be calculated by determining the respective concentrations of the element A and the element D by SIMS (Secondary Ion Microprobe Spectrometry), for example.

In a case where the p-type impurity is the element A and the n-type impurity is the element D in the first SiC region 18, the acceptor levels that contribute to generation of carriers of the element A are preferably 150 meV or shallower, so as to lower the sheet resistance or the resistivity, and the contact resistance. More preferably, the acceptor levels are 100 meV or shallower. Even more preferably, the acceptor levels are 40 meV or shallower.

The acceptor levels of the element A can be determined by measuring the activation energy of the sheet resistance or the resistivity of the first SiC region 18 or the contact resistance between the first SiC region 18 and the first electrode 24.

So as to sufficiently lower the sheet resistance or the resistivity of the first SiC region 18 and the contact resistance between the first SiC region 18 and the first electrode 24, and sufficiently stabilize the surge withstand, most of the p-type impurity and the n-type impurity preferably forms trimers. Therefore, 90% or more of the element D is preferably in the lattice site locations nearest to the element A. If 90% or more of the element D is in the lattice site locations nearest to the element A, most of the p-type impurity and the n-type impurity (90% or more of the part that can form trimers) can be considered to form trimers.

The proportion of the element D in the lattice site locations nearest to the element A can be determined by analyzing the binding state between the element A and the element D by XPS (X-ray Photoelectron Spectroscopy), for example.

Next, a method of manufacturing the semiconductor device of this embodiment is described with reference to FIG. 1.

The method of manufacturing the semiconductor device of this embodiment is the same as a known MPS manufacturing method, except for the formation of the p$^+$-type first SiC region 18.

By the method of manufacturing the semiconductor device of this embodiment, a p-type impurity and an n-type impurity are implanted into SiC through ion implantation, to form a p-type SiC region. Where the p-type impurity is an element A and the n-type impurity is an element D, the element A and the element D is a combination of Al (aluminum), Ga (gallium), or In (indium) and N (nitrogen), and/or a combination of B (boron) and P (phosphorus). The ratio of the dose amount of the element D to the dose amount of the element A in the above combination(s) is higher than 0.33 but lower than 0.995. The ratio of the projected range (Rp) at the time of ion implantation of the n-type impurity to the projected range (Rp) at the time of ion implantation of the p-type impurity is in the range of 90% to 110%. Further, the concentration of the element A forming part of the above combination(s) in the p-type SiC region is not lower than $1\times10^{17}$ cm$^{-3}$ and not higher than $1\times10^{22}$ cm$^{-3}$. Preferably not lower than $1\times10^{18}$ cm$^{-3}$ and not higher than $1\times10^{22}$ cm$^{-3}$.

First, the n-type SiC substrate 12 that contains P (phosphorus) or N (nitrogen) as the n-type impurity at an impurity concentration of approximately $5\times10^{18}$ cm$^{-3}$, for example, has a thickness of 300 μm, for example, and has the low resistance of 4H—SiC, is prepared.

The high-resistance n$^-$-SiC layer 14 that contains N as the n-type impurity at an impurity concentration of approximately $1\times10^{16}$ cm$^{-3}$, for example, and has a thickness of approximately 10 μm is epitaxially grown on one of the faces of the SiC substrate 12 by an epitaxial growth technique.

Al as the p-type impurity is then implanted into the n$^-$-SiC layer 14 through ion implantation using an ion implantation mask, to form the first SiC region 18. N as the n-type impurity is then implanted into the first SiC region 18 through ion implantation using the same ion implantation mask.

In this manner, co-doping is performed through ion implantation of the p-type impurity and the n-type impurity, to form the first SiC region 18. Although the p-type impurity is Al and the n-type impurity is N in this example, the element A and the element D is a combination of Al (aluminum), Ga (gallium), or In (indium) and N (nitrogen), and/or a combination of B (boron) and P (phosphorus) in a case where the p-type impurity is the element A and the n-type impurity is the element D.

To form trimers through interaction between the p-type impurity and the n-type impurity in the first SiC region 18, the distribution of the p-type impurity and the distribution of the n-type impurity that are multiplied by certain percentages are substantially the same in respective locations in the film thickness direction after the ion implantation. Specifically, in the respective locations, conditions for implantation are set so that the ratio between the p-type impurity and the n-type impurity becomes a cenrtain ratio (Al amount:N amount=2:1, for example).

Therefore, the ratio of the projected range (Rp) at the time of ion implantation of the n-type impurity to the projected range (Rp) at the time of ion implantation of the p-type impurity is set within the range of 90% to 110%. More preferably, the ratio is in the range of 95% to 105%.

The diffusion length of an impurity in SiC is shorter than that in Si. Therefore, the projected ranges of the p-type impurity and the n-type impurity may be made to differ from each other, and the junction termination structure 20 may be formed by performing ion implantation in stages divided in accordance with the projected ranges (Rp). As a result, the junction termination structure 20 that has a more uniform impurity concentration distribution in the depth direction can be formed.

So as to lower the sheet resistance or the resistivity of the first SiC region 18, the ratio of the dose amount of N as the n-type impurity to the dose amount of Al as the p-type impurity is higher than 0.33 but lower than 0.995.

Also, so as to lower the sheet resistance or the resistivity of the first SiC region 18 through interaction between the p-type impurity and the n-type impurity, the dose amounts at the time of ion implantation are controlled so that the concentration of Al as the p-type impurity becomes not lower than $1\times10^{17}$ cm$^{-3}$ and not higher than $1\times10^{22}$ cm$^{-3}$.

After the first SiC region 18 is formed by performing co-doping through ion implantation of the p-type impurity and the n-type impurity, annealing for activation is performed. The conditions for the annealing are that an argon (Ar) gas is used as an atmosphere gas, the heating temperature is 1600° C., and the heating period is 30 minutes, for example. At this point, the impurities implanted into the SiC can be activated, but diffusion is small.

After that, the interlayer insulating film 22 formed with an SiO$_2$ film, for example, is formed on the SiC layer 14. The conductive first electrode (the anode electrode) 24 is then formed on the SiC layer 14 and the first SiC region 18. The first electrode 24 is formed by Ni (nickel) sputtering, for example.

The conductive second electrode (the cathode electrode) 26 is formed on the second face side of the SiC substrate 12. The second electrode 26 is formed by Ni sputtering, for example.

Annealing is then performed at a low temperature to lower the contact resistance between the first electrode 24 and the second electrode 26. The annealing is performed in an argon gas atmosphere at 400° C., for example.

By the above described manufacturing method, the MPS 100 shown in FIG. 1 is formed.

According to the manufacturing method in this embodiment, the p$^+$-type first SiC region 18 is co-doped with a p-type impurity such as Al and an n-type impurity such as N. Accordingly, the sheet resistance or the resistivity of the p$^+$-type first SiC region 18 is lowered. Also, the contact resistance between the first SiC region 18 and the first electrode 24 is lowered. Accordingly, the surge withstand is increased, and the highly-reliable MPS 100 can be manufactured.

When the diode switches from the reverse direction to the forward direction to the reverse direction, appearance and disappearance of a depletion layer extending from the first SiC region 18 might not follow the switching if the contact resistance between the first SiC region 18 and the first electrode 24 is high. In this case, a high reverse voltage is unexpectedly applied to the diode, and a surge current might be generated to break the device. According to this embodiment, the contact resistance between the first SiC region 18 and the first electrode 24 is lowered, and sufficient carriers are injected into the first SiC region 18, so that appearance and disappearance of a depletion layer follow the switching with improved efficiency. Accordingly, the surge withstand is increased.

Also, in a case where a high forward voltage is unexpectedly applied to the diode, for example, the contact resistance between the first SiC region 18 and the first electrode 24 is lowered, and the forward current to be applied to the diode is increased accordingly. Thus, the device can be prevented from breaking down, and the surge withstand is increased.

Also, the respective impurities can easily enter lattice points by virtue of the co-doping with the p-type impurity and the n-type impurity. Accordingly, the temperature of the activating anneal can be made lower than that in a case where co-doping is not performed.

Further, the crystalline structures are stabilized by the formation of trimers or pair structures, and characteristics degradation due to expansion of crystal defects formed at the time of ion implantation into SiC can be restrained.

Modification of the First Embodiment

Figure 10:
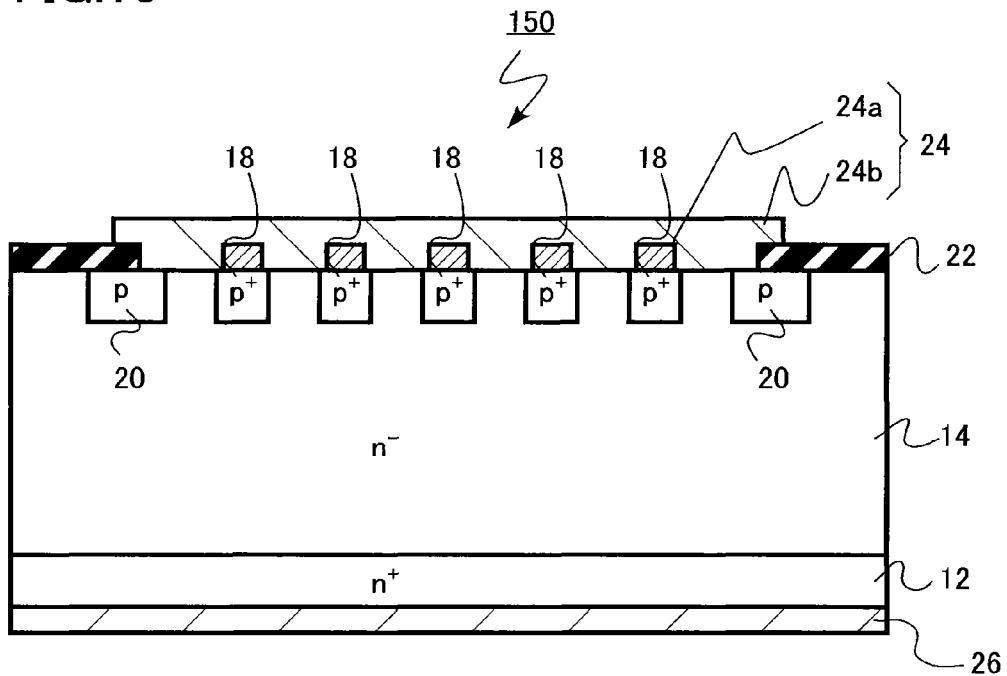
FIG. 10 is a schematic cross-sectional view of a semiconductor device as a modification of the first embodiment.

FIG. 10 is a schematic cross-sectional view of a semiconductor device as a modification of this embodiment. This modification is the same as the first embodiment, except that the first electrode 24 is formed with an ohmic electrode 24a and a schottky electrode 24b that are made of different materials from each other. Therefore, the same explanations as those in the first embodiment will not be repeated.

In the MPS 150 of this modification, the ohmic electrode 24a is in contact with at least part of the p+-type first SiC region 18, and is ohmically connected to the first SiC region 18. The ohmic electrode 24a is made of Ti (titanium), for example.

The schottky electrode 24b is in contact with the n-type SiC layer 14, and is schottky-connected to the n-type SiC layer 14. The schottky electrode 24b is made of Ni (nickel), for example.

In this modification, the first electrode 24 is formed with two different electrodes, so that the ohmic characteristics of the first electrode 24 with respect to the p+-type first SiC region 18 can be more easily improved. Accordingly, a semiconductor device having an even higher surge withstand can be provided.

Second Embodiment

A semiconductor device of this embodiment is the same as that of the first embodiment, except for further including a p-type second SiC region that is formed in the surface of the SiC layer, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element D to the concentration of the element A in the combination(s) being higher than 0.33 but lower than 0.995, the concentration of the element A forming part of the combination(s) being not lower than $1\times10^{17}$ cm$^{-3}$ and not higher than $5\times10^{18}$ cm$^{-3}$, the concentration of the element A being lower than that in the first SiC region. Therefore, the same explanations as those in the first embodiment will not be repeated.

Figure 11:
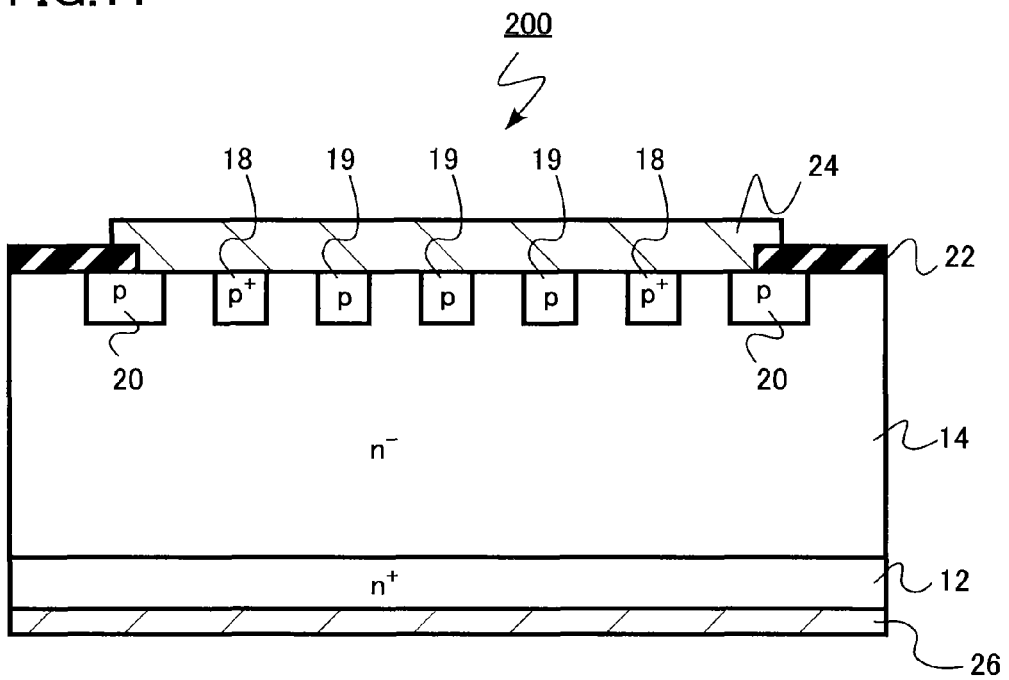
FIG. 11 is a schematic cross-sectional view of a semiconductor device of a second embodiment.
Figure 12:
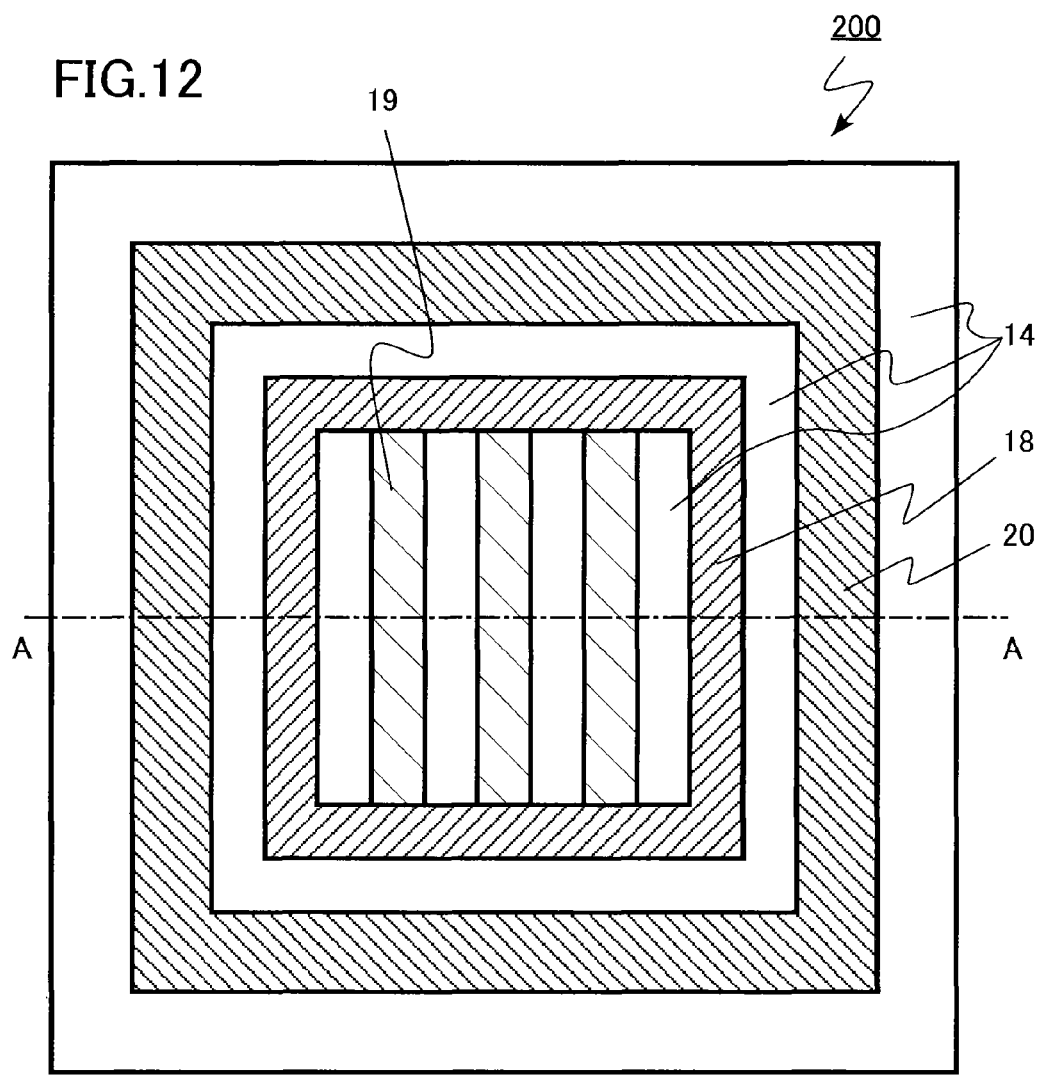
FIG. 12 is a schematic plan view of the semiconductor device of the second embodiment.

FIG. 11 is a schematic cross-sectional view of the semiconductor device of this embodiment. FIG. 12 is a schematic plan view of the semiconductor device of this embodiment. FIG. 11 is a cross-sectional view taken along the line A-A defined in FIG. 12. The semiconductor device of this embodiment is a composite diode of an MPS and a JBS.

This composite diode 200 includes an SiC substrate (a silicon carbide substrate) 12 having first and second faces. In FIG. 11, the first face is the upper face, and the second face is the lower face. This SiC substrate 12 is a 4H—SiC substrate (an n+-substrate) containing N (nitrogen) as the n-type impurity at an impurity concentration that is not lower than $1\times10^{18}$ cm$^{-3}$ and not higher than $1\times10^{19}$ cm$^{-3}$, for example. An n-type SiC layer (an n-SiC layer) 14 containing the n-type impurity at an impurity concentration that is not lower than $5\times10^{15}$ cm$^{-3}$ and not higher than $2\times10^{16}$ cm$^{-3}$, for example, is formed on the first face of the SiC substrate 12. The film thickness of the n$^-$-SiC layer 14 is approximately 5 to 50 μm, for example. The impurity concentration in the n$^-$-SiC layer 14 may be a constant value within the above range, or may exhibit a concentration gradient within the above range. An intermediate layer with a higher concentration may exist between the n$^-$-SiC layer 14 and the substrate.

A p+-type first SiC region 18 containing the p-type impurity at an impurity concentration that is not lower than $1\times10^{18}$ cm$^{-3}$ and not higher than $1\times10^{21}$ cm$^{-3}$, for example, is formed in part of the surface of the n$^-$-SiC layer 14. The depth of the first SiC region 18 is approximately 0.6 μm, for example.

When a high forward voltage is applied to the composite diode 200, the first SIC region 18 causes minority carriers to be injected into the n-type SiC layer 14, and lowers resistance through a conductivity change. Accordingly, the composite diode 200 has a function to increase surge withstand.

The p+-type first SiC region 18 is co-doped with the p-type impurity and the n-type impurity. Where the p-type impurity is an element A and the n-type impurity is an element D, the element A and the element D is a combination of Al (aluminum), Ga (gallium), or In (indium) and N (nitrogen) (a first combination), and/or a combination of B (boron) and P (phosphorus) (a second combination). The ratio of the concentration of the element D to the concentration of the element A in the above combination(s) is higher than 0.33 but lower than 0.995, and the concentration of the element A forming part of the above combination(s) is not lower than $1\times10^{18}$ cm$^{-3}$ and not higher than $1\times10^{21}$ cm$^{-3}$, for example.

A p-type second SiC region 19 that has a lower p-type impurity concentration or a lower element A concentration than that in the first SiC region 18 is formed in the p+-type first SiC region 18. The p-type second SiC region 19 has a function to lower reverse leakage current by depleting the n$^-$-type SiC layer between portions of the second SiC region 19 when a reverse voltage is applied to the composite diode 200.

The p-type second SiC region 19 is co-doped with the p-type impurity and the n-type impurity. Where the p-type impurity is an element A and the n-type impurity is an element D, the element A and the element D is a combination of Al (aluminum), Ga (gallium), or In (indium) and N (nitrogen) (a first combination), and/or a combination of B (boron) and P (phosphorus) (a second combination). The ratio of the concentration of the element D to the concentration of the element A in the above combination(s) is higher than 0.33 but lower than 0.995, and the concentration of the element A forming part of the above combination(s) is not lower than $1\times10^{17}$ cm$^{-3}$ and not higher than $5\times10^{18}$ cm$^{-3}$, for example.

A junction termination structure 20 is provided outside the first SiC region 18. The junction termination structure 20 is a p-type SiC region. The concentration of the p-type impurity is not lower than $1\times10^{17}$ cm$^{-3}$ and not higher than $1\times10^{22}$ cm$^{-3}$, for example. The junction termination structure 20 relaxes the high electric field at the junction termination portions, and realizes the stable high-voltage composite diode 200.

The surface of the n$^-$-SiC layer 14 is coated with an insulating film 22 formed with a silicon oxide film, for example. In the opening of the insulating film 22, a first electrode (an anode electrode) 24 made of Ni (nickel), for example, is formed on the n$^-$-SiC layer 14, the p+-type first SiC region 18, and the p-type second SiC region 19. The first electrode (the anode electrode) 24 is also in contact with part of the surface of the junction termination structure 20.

The first electrode (the anode electrode) 24 is schottky-connected to the n$^-$-SiC layer 14 and the p-type second SiC region 19. The first electrode (the anode electrode) 24 is preferably ohmically connected to the p+-type first SiC region 18.

A second electrode (a cathode electrode) 26 made of Ni, for example, is formed on the lower face of the n+-type 4H—SiC substrate 12.

In a plan view, the ring-like junction termination structure 20 is provided on the outermost circumference, and the ring-like first SiC region 18 is provided inside the junction termination structure 20, as shown in FIG. 12. The linear second SiC region 19 is further provided inside the ring-like first SiC region 18. The linear second SiC region 19 has both ends connected to the first SiC region 18. The region surrounded by the junction termination structure 20 is the active region of the composite diode 200.

The first SiC region 18 and the second SiC region 19 preferably have structures in which the entire regions are continuous as shown in FIG. 12, so that the respective portions stably have the same potential. However, the first SiC region 18 and the second SiC region 19 are not necessarily formed by combining a ring-like portion and linear portions as shown in FIG. 12, but may be formed with ring-like portions, with linear portions, or with circular or polygonal island-like portions.

In the composite diode 200 of this embodiment, the p$^+$-type first SiC region 18 is co-doped with a p-type impurity such as Al and an n-type impurity such as N. As a result, the sheet resistance and the resistivity of the p$^+$-type first SiC region 18 are lowered. Also, the contact resistance between the first SiC region 18 and the first electrode 24 is lowered. Accordingly, the surge withstand is increased, and the highly-reliable composite diode 200 is realized.

In the composite diode 200, the p-type second SiC region 19 is also co-doped with a p-type impurity such as Al and an n-type impurity such as N. As a result, the sheet resistance and the resistivity of the p-type second SiC region 19 are lowered. Further, the contact resistance between the second SiC region 19 and the first electrode 24 is lowered. Accordingly, the second SiC region 19 has the effect to increase the surge withstand as well as the effect to reduce reverse leakage current. Thus, the composite diode 200 with higher reliability is realized.

As trimers are formed in the p$^+$-type first SiC region 18 and the p-type second SiC region 19, the crystalline structures are stabilized, and the number of crystal defects decreases. Accordingly, the composite diode 200 having smaller leakage current is realized. Furthermore, as the number of crystal defects decreases, the ON resistance is also lowered.

The concentration of the p-type impurity contained in the second SiC region 19 is preferably not lower than $1\times10^{17}$ cm$^{-3}$ and not higher than $5\times10^{18}$ cm$^{-3}$. This is because, if the concentration is below this range, the contact resistance between the second SiC region 19 and the first electrode 24 might become too high. This is also because, if the concentration is below the range, there is a possibility that interaction between the p-type impurity and the n-type impurity does not occur, and trimers are not formed, particularly when co-doping is performed through ion implantation.

This is also because, if the concentration is above the range, the reverse characteristics between the second SiC region 19 and the SiC layer 14 might be degraded.

In a case where the p-type impurity is the element A and the n-type impurity is the element D in the second SiC region 19, the ratio of the concentration of the element D to the concentration of the element A is higher than 0.33 but lower than 0.995, so as to sufficiently lower the sheet resistance or the resistivity of the second SiC region 19 and the contact resistance between the second SiC region 19 and the first electrode 24. Also, the ratio of the concentration of the element D to the concentration of the element A is preferably higher than 0.40 but lower than 0.95. More preferably, the ratio is not lower than 0.45 and not higher than 0.75. Even more preferably, the ratio is not lower than 0.47 and not higher than 0.60.

In a case where the p-type impurity is the element A and the n-type impurity is the element D in the second SiC region 19, the acceptor levels that contribute to generation of carriers of the element A are preferably 150 meV or shallower, so as to lower the sheet resistance or the resistivity, and the contact resistance. More preferably, the acceptor levels are 100 meV or shallower. Even more preferably, the acceptor levels are 40 meV or shallower.

So as to sufficiently lower the sheet resistance or the resistivity of the second SiC region 19 and the contact resistance between the second SiC region 19 and the first electrode 24, and sufficiently stabilize the surge withstand, most of the p-type impurity and the n-type impurity preferably forms trimers. Therefore, 90% or more of the element D is preferably in the lattice site locations nearest to the element A. If 90% or more of the element D is in the lattice site locations nearest to the element A, most of the p-type impurity and the n-type impurity (90% or more of the part that can form trimers) can be considered to form trimers.

With the composite diode 200 of this embodiment, the increase in surge withstand by the first SiC region 18, and the reduction in reverse leakage current by the second SiC region 19 can be optimized independently of each other. In other words, parameters such impurity concentrations, region widths, and areas can be set in the respective impurity regions independently of each other. Thus, the composite diode 200 that excels in rectifying characteristics is realized.

The composite diode 200 of this embodiment can be manufactured by using the co-doping process of the first embodiment in forming the second SiC region 19.

Third Embodiment

A semiconductor device of this embodiment is the same as that of the first embodiment, except that the concentration of the element A in the first SiC region is not lower than $1\times10^{17}$ cm$^{-3}$ and not higher than $5\times10^{18}$ cm$^{-3}$. Therefore, the same explanations as those in the first embodiment will not be repeated.

Figure 13:
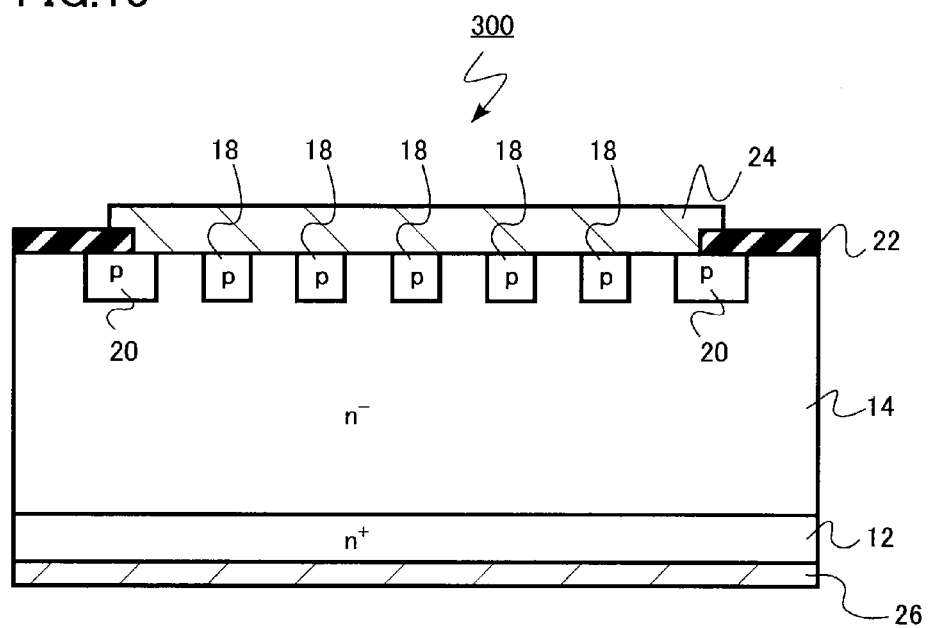
FIG. 13 is a schematic cross-sectional view of a semiconductor device of a third embodiment.
Figure 14:
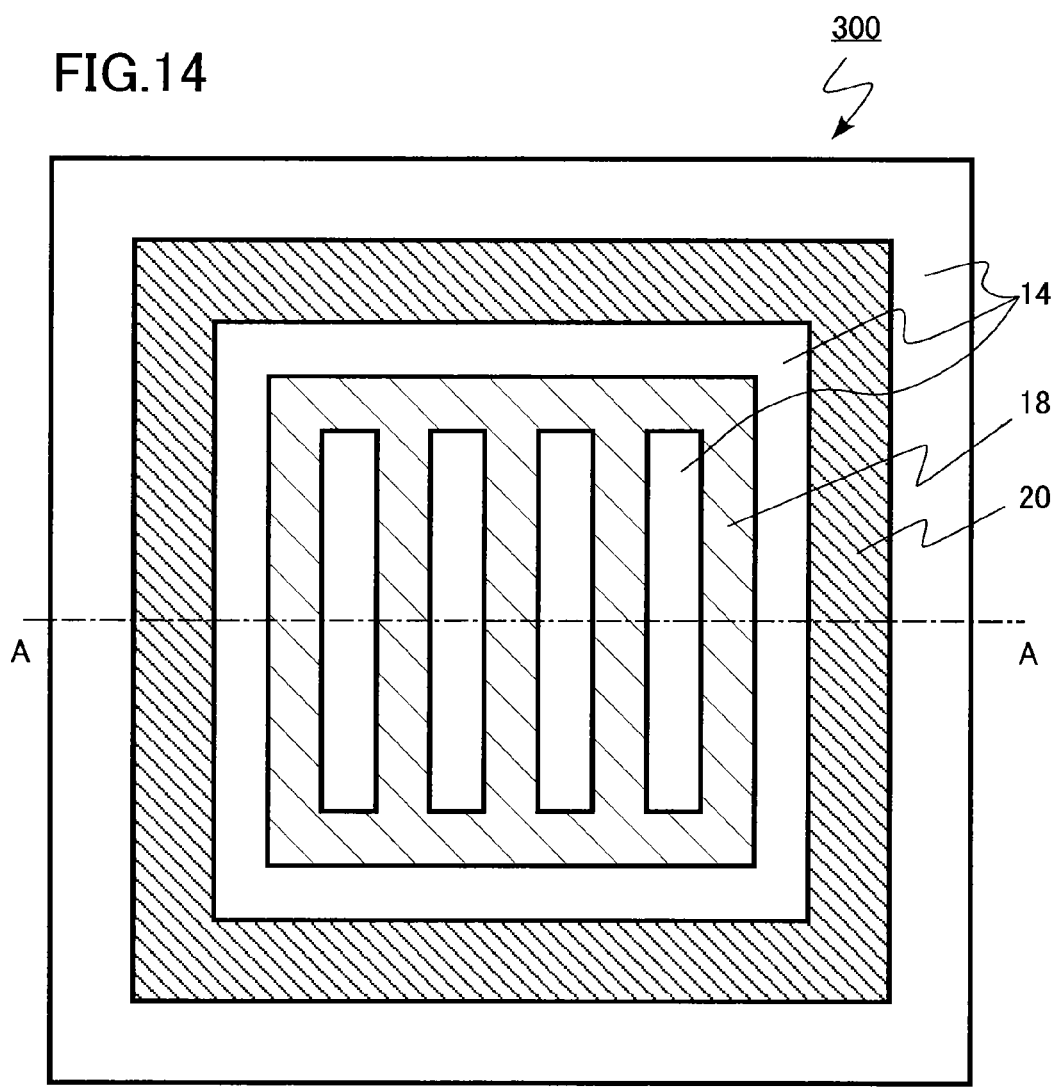
FIG. 14 is a schematic plan view of the semiconductor device of the third embodiment.

FIG. 13 is a schematic cross-sectional view of the semiconductor device of this embodiment. FIG. 14 is a schematic plan view of the semiconductor device of this embodiment. FIG. 13 is a cross-sectional view taken along the line A-A defined in FIG. 14. The semiconductor device of this embodiment is a JBS.

This JBS 300 includes an SiC substrate (a silicon carbide substrate) 12 having first and second faces. In FIG. 13, the first face is the upper face, and the second face is the lower face. This SiC substrate 12 is a 4H—SiC substrate (an n$^+$-substrate) containing N (nitrogen) as the n-type impurity at an impurity concentration that is not lower than $1\times10^{18}$ cm$^{-3}$ and not higher than $1\times10^{19}$ cm$^{-3}$, for example.

An n-type SiC layer (an n$^-$-SiC layer) 14 containing the n-type impurity at an impurity concentration that is not lower than $5\times10^{15}$ cm$^{-3}$ and not higher than $2\times10^{16}$ cm$^{-3}$, for example, is formed on the first face of the SiC substrate 12. The film thickness of the n$^-$-SiC layer 14 is approximately 5 to 50 μm, for example.

A p$^+$-type first SiC region 18 containing the p-type impurity at an impurity concentration that is not lower than $1\times10^{17}$ cm$^{-3}$ and not higher than $5\times10^{18}$ cm$^{-3}$, for example, is formed in part of the surface of the n$^-$-SiC layer 14. The depth of the first SiC region 18 is approximately 0.6 μm, for example.

When a reverse voltage is applied to the JBS 300, the first SiC region 18 has a depletion layer extending into the portions of the n-type SiC layer 14 located between portions of the first SiC region 18. Accordingly, the first SiC region 18 has a function to reduce reverse leakage current in the JBS 300.

The p-type first SiC region 18 is co-doped with the p-type impurity and the n-type impurity. Where the p-type impurity is an element A and the n-type impurity is an element D, the element A and the element D is a combination of Al (aluminum), Ga (gallium), or In (indium) and N (nitrogen) (a first combination), and/or a combination of B (boron) and P (phosphorus) (a second combination). The ratio of the concentration of the element D to the concentration of the element A in the above combination(s) is higher than 0.33 but lower than 0.995, and the concentration of the element A forming part of the above combination(s) is not lower than $1\times10^{17}$ cm$^{-3}$ and not higher than $5\times10^{18}$ cm$^{-3}$.

It should be noted that this embodiment does not exclude elements other than the above mentioned elements as p-type impurities and n-type impurities. In the following, an example case where the element A is Al (aluminum) and the element D is N (nitrogen) is described.

A junction termination structure 20 is provided outside the first SiC region 18. The junction termination structure 20 is a p-type SiC region. The concentration of the p-type impurity is not lower than $1×10^{17}$ $cm^{-3}$ and not higher than $1×10^{22}$ $cm^{-3}$, for example. The junction termination structure 20 relaxes the high electric field at the junction termination portions, and realizes the stable high-voltage JBS 300.

The surface of the $n^-$-SiC layer 14 is coated with an insulating film 22 formed with a silicon oxide film, for example. In the opening of the insulating film 22, a first electrode (an anode electrode) 24 made of Ni (nickel), for example, is formed on the $n^-$-SiC layer 14 and the p-type first SiC region 18. The first electrode (the anode electrode) 24 is also in contact with part of the surface of the junction termination structure 20.

The first electrode (the anode electrode) 24 is schottky-connected to the $n^-$-SiC layer 14. The first electrode (the anode electrode) 24 is also schottky-connected to the p-type first SiC region 18.

A second electrode (a cathode electrode) 26 made of Ni, for example, is formed on the lower face of the $n^+$-type 4H—SiC substrate 12.

In a plan view, the ring-like junction termination structure 20 is provided on the outermost circumference, and the first SiC region 18 formed by combining a ring-like portion and linear portions is provided inside the junction termination structure 20, as shown in FIG. 14. The region surrounded by the junction termination structure 20 is the active region of the JBS 300.

The first SiC region 18 preferably has a structure in which the entire region is continuous as shown in FIG. 14, so that the respective portions stably have the same potential. However, the first SiC region 18 is not necessarily formed by combining a ring-like portion and linear portions as shown in FIG. 14, but may be formed with ring-like portions, with linear portions, or with circular or polygonal island-like portions.

In the JBS 300 of this embodiment, the p-type first SiC region 18 is co-doped with a p-type impurity such as Al and an n-type impurity such as N. As a result, the sheet resistance and the resistivity of the p-type first SiC region 18 are lowered. Also, the contact resistance between the first SiC region 18 and the first electrode 24 is lowered. Accordingly, the first SiC region 18 has the effect to increase the surge withstand as well as the effect to reduce reverse leakage current. Thus, the highly-reliable JBS 300 is realized.

As trimers are formed in the p-type first SiC region 18, the crystalline structures are stabilized, and the number of crystal defects decreases. Accordingly, the JBS 300 having smaller leakage current is realized. Furthermore, as the number of crystal defects decreases, the ON resistance is also lowered.

The concentration of the p-type impurity contained in the first SiC region 18 is preferably not lower than $1×10^{17}$ $cm^{-3}$ and not higher than $5×10^{18}$ $cm^{-3}$. This is because, if the concentration is below this range, the contact resistance between the first SiC region 18 and the first electrode 24 might become too high. This is also because, if the concentration is below the range, there is a possibility that interaction between the p-type impurity and the n-type impurity does not occur, and trimers are not formed, particularly when co-doping is performed through ion implantation.

This is also because, if the concentration is above the range, the leakage current between the first SiC region 18 and the SiC layer 14 might increase.

In a case where the p-type impurity is the element A and the n-type impurity is the element D in the first SiC region 18, the ratio of the concentration of the element D to the concentration of the element A is higher than 0.33 but lower than 0.995, so as to sufficiently lower the sheet resistance or the resistivity of the first SiC region 18 and the contact resistance between the first SiC region 18 and the first electrode 24. Also, the ratio of the concentration of the element D to the concentration of the element A is preferably higher than 0.40 but lower than 0.95. More preferably, the ratio is not lower than 0.45 and not higher than 0.75. Even more preferably, the ratio is not lower than 0.47 and not higher than 0.60.

In a case where the p-type impurity is the element A and the n-type impurity is the element D in the first SiC region 18, the acceptor levels that contribute to generation of carriers of the element A are preferably 150 meV or shallower, so as to lower the sheet resistance or the resistivity, and the contact resistance. More preferably, the acceptor levels are 100 meV or shallower. Even more preferably, the acceptor levels are 40 meV or shallower.

So as to sufficiently lower the sheet resistance or the resistivity of the first SiC region 18 and the contact resistance between the first SiC region 18 and the first electrode 24, and sufficiently stabilize the surge withstand, most of the p-type impurity and the n-type impurity preferably forms trimers. Therefore, 90% or more of the element D is preferably in the lattice site locations nearest to the element A. If 90% or more of the element D is in the lattice site locations nearest to the element A, most of the p-type impurity and the n-type impurity (90% or more of the part that can form trimers) can be considered to form trimers.

Although silicon carbide crystalline structures are 4H—SiC in the above described embodiments, the embodiments can also be applied to silicon carbides having other crystalline structures such as 6H—SiC and 3C—SiC.

Also, in the above described embodiments, the combination of a p-type impurity and an n-type impurity is a combination of Al (aluminum) and N (nitrogen). However, the combination is not limited to that, and the same effects as above can be achieved, as long as the combination is a combination of Al (aluminum), Ga (gallium), or In (indium) and N (nitrogen), and/or a combination of B (boron) and P (phosphorus).

Although diodes are formed by using n-type SiC substrates in the first through third embodiments, diodes may be formed by using p-type SiC substrates, instead of n-type SiC substrates. In this case, the the respective conductivity types of the SiC substrates, the SiC layers, and the SiC regions of the first through third embodiments are reversed.

The preferred conditions for co-doping n-type SiC in this case are as follows.

Where the p-type impurity is an element A and the n-type impurity is an element D, the element A and the element D is a combination of Al (aluminum), Ga (gallium), or In (indium) and N (nitrogen), and/or a combination of B (boron) and P (phosphorus). Further, the ratio of the concentration of the element A to the concentration of the element D in the above combination(s) is higher than 0.40 but lower than 0.95. The concentration of the element D forming part of the above combination(s) is not lower than $1×10^{17}$ $cm^{-3}$ and not higher than $1×10^{22}$ $cm^{-3}$.

In a case where the p-type impurity is the element A and the n-type impurity is the element D, the ratio of the concentration of the element A to the concentration of the element D is higher than 0.40 but lower than 0.95. Also, the ratio of the concentration of the element A to the concentration of the element D is preferably not lower than 0.45 and not higher than 0.75. More preferably, the ratio is not lower than 0.47 and not higher than 0.60.

In a case where the p-type impurity is the element A and the n-type impurity is the element D, the donor levels that contribute to generation of carriers of the element D are preferably 40 meV or shallower. More preferably, the donor levels are 35 meV or shallower. Even more preferably, the donor levels are 20 meV or shallower.

Most of the p-type impurity and the n-type impurity preferably forms trimers. Therefore, 90% or more of the element A is preferably in the lattice site locations nearest to the element D. If 90% or more of the element A is in the lattice site locations nearest to the element D, most of the p-type impurity and the n-type impurity (90% or more of the part that can form trimers) can be considered to form trimers.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an n-type SiC substrate having first face and second face;
   an n-type SiC layer formed on a first face side of the SiC substrate;
   a p-type first SiC region formed in a surface of the SiC layer, the first SiC region containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A forming the at least one of the combinations being higher than 0.33 but lower than 0.995, the concentration of the element A forming part of the at least one of the combinations being not lower than $1\times10^{17}$ cm$^{-3}$ and not higher than $1\times10^{22}$ cm$^{-3}$;
   a first electrode formed on the SiC layer and the first SiC region; and
   a second electrode formed on a second face side of the SiC substrate.

2. The device according to claim 1, wherein the concentration of the element A is not lower than $1\times10^{18}$ cm$^{-3}$ and not higher than $1\times10^{21}$ cm$^{-3}$.

3. The device according to claim 2, wherein
   the first electrode is schottky-connected to the SiC layer, and
   the first electrode is ohmically connected to the first SiC region.

4. The device according to claim 2, further comprising
   a p-type second SiC region formed in the surface of the SiC layer, the second SiC region containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A in the at least one of the combinations being higher than 0.33 but lower than 0.995, the concentration of the element A forming part of the at least one of the combinations being not lower than $1\times10^{17}$ cm$^{-3}$ and not higher than $5\times10^{18}$ cm$^{-3}$, the concentration of the element A being lower than the concentration of the element A in the first SiC region,
   wherein the first electrode is provided on the SiC layer, the first SiC region, and the second SiC region.

5. The device according to claim 4, wherein
   the first electrode is schottky-connected to the SiC layer and the second SiC region, and
   the first electrode is ohmically connected to the first SiC region.

6. The device according to claim 1, wherein the concentration of the element A is not lower than $1\times10^{17}$ cm$^{-3}$ and not higher than $5\times10^{18}$ cm$^{-3}$.

7. The device according to claim 6, wherein the first electrode is schottky-connected to the SiC layer and the first SiC region.

8. The device according to claim 1, wherein the ratio of the concentration of the element D to the concentration of the element A in the first SiC region is higher than 0.40 but lower than 0.95.

9. The device according to claim 1, wherein an acceptor level of the element A in the first SiC region is 150 meV or shallower.

10. The device according to claim 1, wherein 90% or more of the element D in the first SiC region is in a lattice site location nearest to the element A.

* * * * *